(12) United States Patent
Aleksov et al.

(10) Patent No.: US 11,894,324 B2
(45) Date of Patent: Feb. 6, 2024

(54) IN-PACKAGE RF WAVEGUIDES AS HIGH BANDWIDTH CHIP-TO-CHIP INTERCONNECTS AND METHODS FOR USING THE SAME

(71) Applicant: Intel Corporation, Santa Clara, CA (US)

(72) Inventors: Aleksandar Aleksov, Chandler, AZ (US); Telesphor Kamgaing, Chandler, AZ (US); Sri Ranga Sai Boyapati, Chandler, AZ (US); Kristof Darmawikarta, Chandler, AZ (US); Eyal Fayneh, Givatayim (IL); Ofir Degani, Haifa (IL); David Levy, Haifa (IL); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 17/528,049

(22) Filed: Nov. 16, 2021

(65) Prior Publication Data
US 2022/0084965 A1 Mar. 17, 2022

Related U.S. Application Data

(63) Continuation of application No. 16/604,144, filed as application No. PCT/US2017/038114 on Jun. 19, 2017, now Pat. No. 11,211,345.

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4857* (2013.01); *H01L 23/5383* (2013.01);
(Continued)

(58) Field of Classification Search
CPC ... H01L 21/4857; H01L 23/66; H01L 23/538; H01L 23/5386; H01L 24/13; H01L 24/16;
(Continued)

(56) References Cited

U.S. PATENT DOCUMENTS 7,907,803 B2  3/2011  Hodono
9,842,813 B2  12/2017 Jiang
(Continued)

FOREIGN PATENT DOCUMENTS

KR   10-2010-0111247   10/2010

OTHER PUBLICATIONS

International Search Report and Written Opinion for International Patent Application No. PCT/US2017/038114 dated Mar. 19, 2018, 14 pgs.

(Continued)

*Primary Examiner* — Kyoung Lee
*Assistant Examiner* — Christina A Sylvia
(74) *Attorney, Agent, or Firm* — Schwabe, Williamson & Wyatt, P.C.

(57) ABSTRACT

In-package radio frequency (RF) waveguides as high bandwidth chip-to-chip interconnects and methods for using the same are disclosed. In one example, an electronic package includes a package substrate, first and second silicon dies or tiles, and an RF waveguide. The first and second silicon dies or tiles are attached to the package substrate. The RF waveguide is formed in the package substrate and interconnects the first silicon die or tile with the second silicon die or tile.

25 Claims, 17 Drawing Sheets

(51) Int. Cl.
*H01L 23/538* (2006.01)
*H01L 23/00* (2006.01)
*H01L 25/065* (2023.01)
*H01L 25/00* (2006.01)

(52) U.S. Cl.
CPC .......... *H01L 23/5386* (2013.01); *H01L 24/16* (2013.01); *H01L 25/0652* (2013.01); *H01L 25/0655* (2013.01); *H01L 25/50* (2013.01); *H01L 24/17* (2013.01); *H01L 2223/6627* (2013.01); *H01L 2224/16146* (2013.01); *H01L 2224/16227* (2013.01); *H01L 2224/16238* (2013.01); *H01L 2224/1703* (2013.01); *H01L 2224/17181* (2013.01); *H01L 2225/06513* (2013.01); *H01L 2225/06517* (2013.01); *H01L 2225/06541* (2013.01); *H01L 2225/06568* (2013.01); *H01L 2924/19033* (2013.01)

(58) Field of Classification Search
CPC ..... H01L 24/17; H01L 25/18; H01L 25/0652; H01L 25/0655; H01L 25/50; H01L 2223/6627; H01L 2224/16146; H01L 2224/131; H01L 2224/16145; H01L 2224/16227; H01L 2224/16238; H01L 2224/1703; H01L 2224/17181; H01L 2225/06513; H01L 2225/06517; H01L 2225/06541; H01L 2225/06568; H01L 2924/15192; H01L 2924/15311; H01L 2924/19033; H01L 2223/66–6694
See application file for complete search history.

(56) References Cited

U.S. PATENT DOCUMENTS

| | | | |
|---|---|---|---|
| 10,163,825 | B1 | 12/2018 | Liao |
| 11,195,806 | B2 * | 12/2021 | Nair ....................... H01P 11/002 |
| 11,652,059 | B2 * | 5/2023 | Elsherbini ............... H01L 24/20 |
| | | | 257/778 |
| 2002/0074637 | A1 | 6/2002 | McFarland |
| 2007/0096249 | A1 * | 5/2007 | Roeper ................... H01L 25/16 |
| | | | 257/E23.101 |
| 2010/0327424 | A1 * | 12/2010 | Braunisch ............... H01L 24/73 |
| | | | 257/692 |
| 2012/0223325 | A1 | 9/2012 | Tang |
| 2013/0265734 | A1 | 10/2013 | Herbsommer et al. |
| 2014/0154999 | A1 | 6/2014 | Rofougaran |
| 2015/0214191 | A1 * | 7/2015 | Lee ........................ H01L 21/563 |
| | | | 257/777 |
| 2015/0228550 | A1 * | 8/2015 | Yu ........................... H01L 22/20 |
| | | | 257/48 |
| 2016/0178861 | A1 | 6/2016 | Osenbach |
| 2016/0276727 | A1 | 9/2016 | Dang |
| 2016/0276729 | A1 * | 9/2016 | Dang ....................... H01P 5/107 |
| 2016/0336638 | A1 | 11/2016 | Dang et al. |
| 2020/0118951 | A1 * | 4/2020 | Aleksov ............... H01L 21/4857 |
| 2020/0294940 | A1 | 9/2020 | Dogiamis |
| 2020/0388583 | A1 * | 12/2020 | Theuss ................ H01L 23/5283 |
| 2022/0416393 | A1 * | 12/2022 | Dogiamis ............... H01L 24/80 |

OTHER PUBLICATIONS

International Preliminary Report on Patentability for International Patent Application No. PCT/US2017/038114, dated Jan. 2, 2020, 10 pages.

* cited by examiner

IN-PACKAGE RF WAVEGUIDES AS HIGH BANDWIDTH CHIP-TO-CHIP INTERCONNECTS AND METHODS FOR USING THE SAME

CROSS-REFERENCE TO RELATED APPLICATION

This patent application is a continuation of U.S. patent application Ser. No. 16/604,144, filed Oct. 9, 2019, which is a U.S. National Phase Application under 35 U.S.C. § 371 of International Application No. PCT/US2017/038114, filed Jun. 19, 2017, entitled "IN-PACKAGE RF WAVEGUIDES AS HIGH BANDWIDTH CHIP-TO-CHIP INTERCONNECTS AND METHODS FOR USING THE SAME," which designates the United States of America, the entire disclosure of which are hereby incorporated by reference in their entirety and for all purposes.

FIELD

Embodiments of the invention are in the field of semiconductors including electronic packaging and interconnects. More particularly, embodiments of the invention relate to in-package radio frequency (RF) waveguides as high bandwidth chip-to-chip interconnects (HBI) and methods for using the same.

BACKGROUND

Modern central processing units (CPUs) or processors are essentially a system on a chip (SOC), which is silicon die having integrated functional areas for processing and graphics cores, caches, memory controllers, and external input/output (I/O) circuitry. Advanced processing technologies, e.g., 10 nm node or 14+nm node, can be used to fabricate complex functional areas such a graphics and processing cores and less complex areas such as cache and I/O circuitry to advance wafer utilization, yield, and cost of the SOC. Once fabricated, the silicon die is attached with a substrate and outer covering as part of an electronic package that forms the CPU or processor.

Yet, in sustaining Moore's law to increase the density of circuits or transistors in a limited area, a number of techniques have been used to connect different functional areas in an electronic package. One technique is three-dimensional 3D die-to-die stacking using through-silicon-via (TSV) connection. For this technique, silicon dies are stacked together and connected by and a vertical electrical connection (via) passing completely through the silicon dies. This technique can complicate power delivery to the top die and may be detrimental to cooling of the bottom die. Another technique uses a silicon interposer and TSV connection that forms a via through the interposer to make connections to the silicon die. This technique can limit the interposer size, yield, and reticle size to make the vias accurately on a wafer, which can make this technique costly.

Another technique is the embedded multi-die interconnect bridge (EMIB) that uses a bridge to connect silicon dies. If the silicon dies are complex and large requiring a large number of interconnects, an increased number of bridges may be needed, which can limit substrate packaging and assembly. Another technique is very high density (VHD) interconnects that uses organic packages, which requires new tools and facilities and cost intensive. These techniques also require high I/O density per interconnect level having limited data rates and bandwidth per interconnect. Such interconnects are also affected by wafer and functional area size and yield issues. Wafer yields tend to increase as size decreases and, if interconnects require a large area on the wafer, data rates for the interconnects are slow.

BRIEF DESCRIPTION OF THE DRAWINGS

The appended drawings illustrate examples and are, therefore, exemplary embodiments and not considered to be limiting in scope.

DETAILED DESCRIPTION

Figure 1:
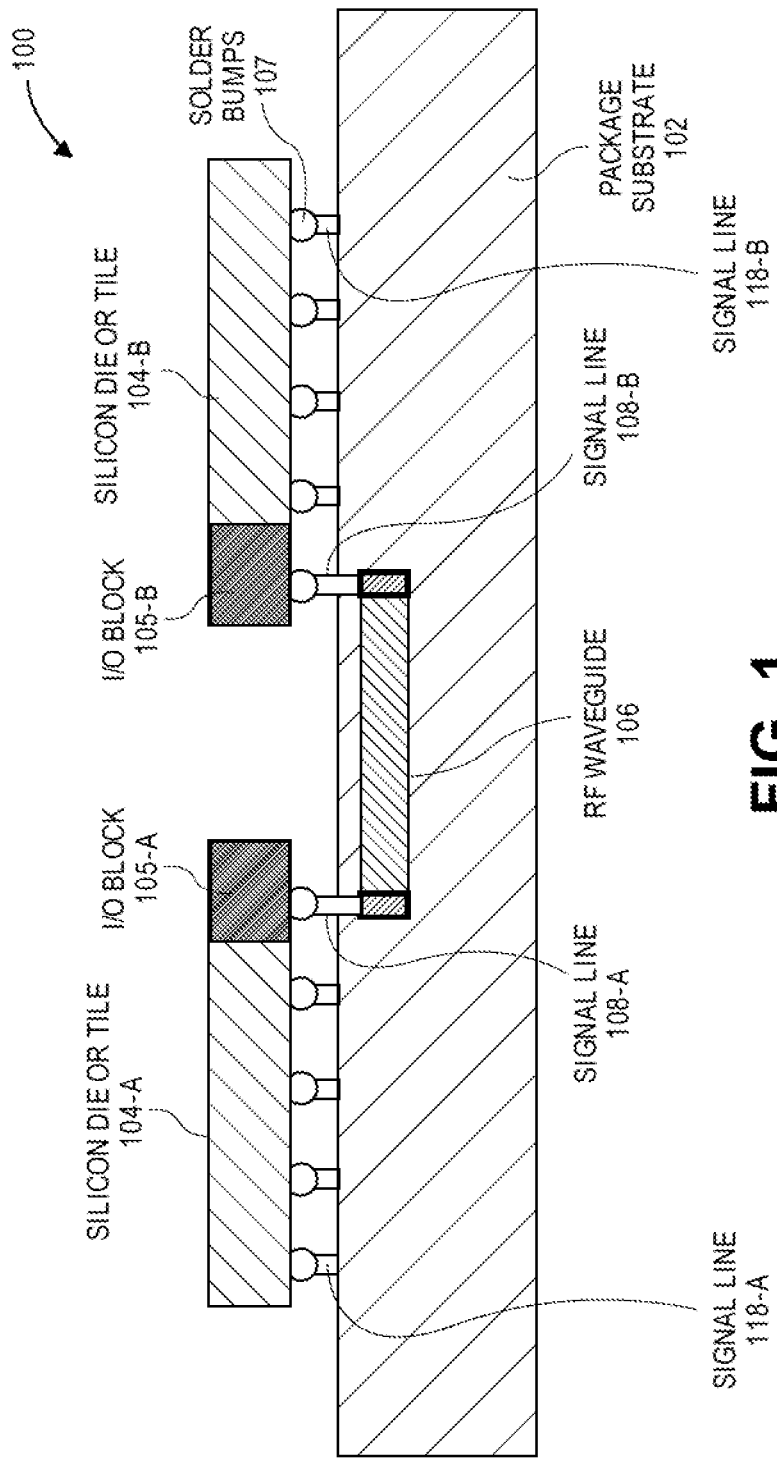
FIG. 1 is a cross sectional view of one example of an electronic package having in-package RF waveguide that provides a high bandwidth chip-to-chip interconnect (HBI).

In-package RF waveguides as high-bandwidth chip-to-chip interconnect (HBI) between silicon dies (chips) or tiles and methods for using the same are described. In one example, an electronic package includes a package substrate, first silicon die or tile, a second die or tile, a radio frequency (RF) waveguide. The first silicon die or tile and second silicon die or tile are attached to the package substrate. The RF waveguide is formed in the package substrate interconnecting the first silicon die or tile with the second silicon die or tile.

In another example, an electronic package includes a package substrate, a first silicon chip and second silicon chip, and a multi-layer RF waveguide structure. The first silicon chip and a second silicon chip are attached to the package substrate. The multi-layer RF waveguide structure is formed in the package substrate interconnecting the first silicon chip and the second silicon chip. In one example, the multi-layer RF waveguide structure includes two waveguides, e.g., a first grounded co-planar waveguide and a second coaxial waveguide, which can interconnect any number of silicon dies (or chips) or tiles. In another example, a system on a chip includes a substrate and a plurality of silicon die tiles attached to the substrate. The substrate includes at least one high-bandwidth interconnect (HBI) including a radio frequency (RF) waveguide structure formed in the substrate to interconnect the plurality silicon die tiles.

In another example, a device includes a substrate, a RF waveguide formed in the substrate, and first and second stacked dies attached to the substrate. The RF waveguide interconnects the first and second stacked dies attached to the substrate. In another example, a computing system includes an input and output devices and at least one integrated circuit die. The integrated circuit die includes a substrate and at least two die areas interconnected by a radio frequency (RF) waveguide formed in the substrate.

The disclosed in-package RF waveguides can be compact providing low I/O density electronic packages, e.g., packages having an I/O density of 5-20 per mm die edge with. The RF waveguides can provide ultra-high bandwidth RF signals that can modulate any number of signals at high carrier frequencies, e.g., from 1-200 Gigahertz (GHz), between silicon dies or tiles. Any type of modulation scheme can be used for the RF waveguides disclosed herein such as quadrature amplitude modulation (QAM) and, in particular QAM-4 modulation, for digital communications. Thus, the disclosed RF waveguides act as high-bandwidth interconnect HBI between silicon dies (or chips) or tiles. In some examples, the RF waveguides can be formed in the package substrate using existing package substrate manufacturing processes and design rules without requiring new tools or separate package substrate fabrication. This allows for seamless integration into existing manufacturing process flows for electronic packaging fabrication. The RF waveguides disclosed herein can also minimize design and manufacturing resources, decreasing silicon die areas, and increasing wafer utilization and yields.

In the following description, numerous and specific details are set forth, such as packaging and interconnect designs, in order to provide a thorough understanding of the examples and embodiments of the present invention. It will be apparent that the examples and embodiments described herein may be practiced without one or more of these specific details. In other instances, well-known features, such as specific semiconductor fabrication processes, have not been described so as to avoid obscuring the details of the exemplary embodiments.

In-Package RF Waveguide Interconnect Basic Architecture

FIG. 1 is a cross sectional view of one example of an electronic package 100 having an in-package RF waveguide 106 providing a high bandwidth chip-to-chip interconnect (HBI). In this example, the electronic package 100 (with the outer cover removed) includes a package substrate 102 and silicon dies or tiles 104-A and 104-B with corresponding input/output (I/O) blocks 105-A and 105-B coupled to RF waveguide 106 formed in package substrate 102. Examples of package substrate 102 can include organic material such as glass or ceramic. Silicon dies or tiles 104-A and 104-B can also be silicon chips. In one example, silicon dies or tiles 104-A and 104-B are attached to package substrate 102 using solder bumps 107 and signal lines 108-A and 108-B. For one example, RF waveguide 106 can be a waveguide structure formed in substrate 102 as a grounded co-planar waveguide (GCW) having ground planes (or lines) around signal lines, and, in other examples, RF waveguide 106 can be a coaxial waveguide having ground planes (or lines) surrounding signal lines. In the following examples, signal lines and ground planes can be made of copper or other standard metals or alloys. In other examples, RF waveguide 106 can be a hollow waveguide integrated into substrate 102, or any type of waveguides to communicate high bandwidth signals.

RF waveguide 106 is configured to provide ultra-high bandwidth RF signal communication between silicon dies or tiles 104-A and 104-B. For example, RF waveguide 106 can transmit and receive RF signals at high data rates such as 200 gigabits/second (Gb/s) to and from silicon dies or tiles 104-A and 104-B. In one example, at an I/O density of 5-20 I/O per mm die edge width, an RF waveguide 106 for each I/O (e.g., 8-12 RF waveguides) can provide accumulative data rates of 1-2.4 terabits/second (Tb/s) and any number of signals and data channels can be modulated at high frequencies such as from 1-200 GHz using any type of modulation scheme (e.g., QAM-4). Thus, RF waveguide 106 provides a high-bandwidth interconnect (HBI) between silicon dies or tiles 104-A and 104-B.

Within silicon dies or tiles 104-A and 104-B, respective I/O blocks 105-A and 105-B are coupled to RF waveguide 106 by way of solder bumps 107 and signal lines 108-A and 108-B. In one example, I/O blocks 105-A and 105-B are configured to provide ultra-high bandwidth RF signal communication using high frequency carrier signals, e.g., 1-200 GHz carrier signals, modulating any number of signals for any number of data channels using standard modulation schemes (e.g., QAM-4) to and from RF waveguide 106 for silicon dies or tiles 104-A and 104-B using signals lines 118-A and 118-B. In one example, I/O blocks 105-A and 105-B are up and down converting broadband transceivers and can include RF circuitry to up-convert low frequency RF signals into high frequency signals and down-convert high frequency signals into low frequency signals. I/O blocks 105-A and 105-B can communicate signals in gigahertz (GHz) frequency ranges.

Solder bumps 107 for silicon dies or tiles 104-A and 104-B can be coupled to other signal lines or ground lines to other RF waveguides or connections. In one example, silicon dies or tiles 104-A and 104-B can be separate cores for different functional areas of a CPU or processor in which signals are passed using RF waveguide 106 as a HBI.

In operation, for example, at I/O block 105-A, silicon die or tile 104-A, communicates ultra-high bandwidth RF signals through a respective solder bump 107 and signal line 108-A to RF waveguide 106. RF waveguide 106 can communicate the ultra-high bandwidth RF signals to I/O block 105-B through signal line 108-B and respective solder bump 107 to silicon die or tile 104-B. Likewise, silicon die or tile 104-B can communicate ultra-high bandwidth RF signals through RF waveguide 106 received by silicon die or tile 1040A. Thus, RF waveguide 106 is capable of communicating signals between silicon die tiles 104-A and 104-B through signal lines 108-A and 108-B, solder bumps 107, and I/O blocks 105-A and 105-B at ultra-high bandwidths.

Multi-Layer RF Waveguide Structures

Figure 2A:
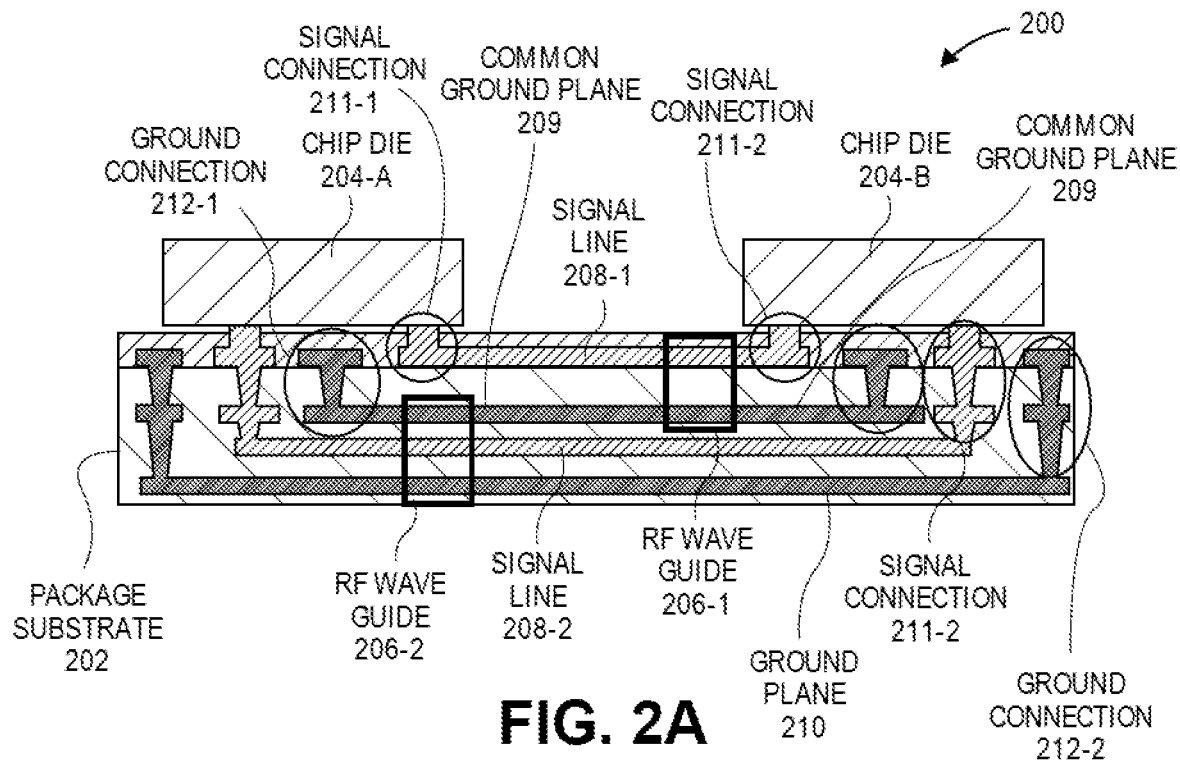
FIGS. 2A and 2B are cross-sectional view examples of an electronic package having multi-layer RF waveguide interconnects.
Figure 2B:
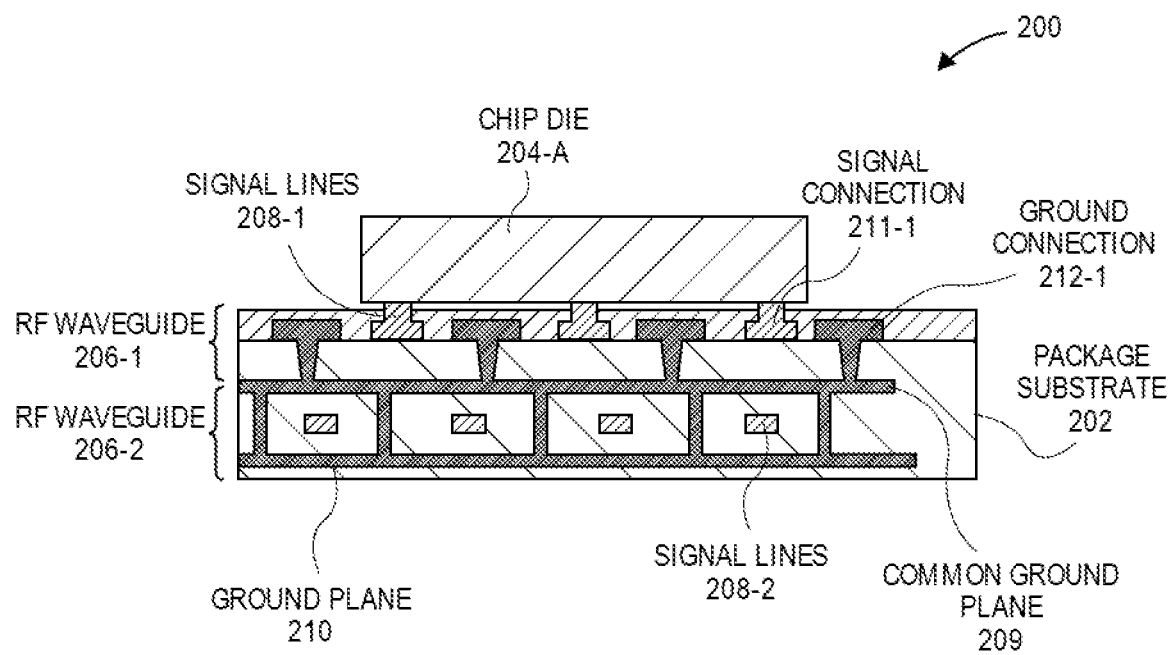

FIGS. 2A and 2B are cross sectional view examples of an electronic package 200 using a multi-layer or tiered RF waveguide structure as a HBI. In the examples of FIGS. 2A and 2B, the RF waveguide structure includes two waveguide structures interconnecting a first die chip and a second die chip. The RF waveguide structure can have any number of waveguides interconnecting any number of silicon dies, chips or tiles. In the following examples, the RF waveguide structure includes a first wave guide forming a grounded co-planar waveguide and a second waveguide structure forming a coaxial waveguide.

Referring to FIG. 2A, in one example, electronic package 200 includes two RF waveguide structures 206-1 and 206-2 interconnecting chip dies 204-A and 204-B. In this example, the top RF waveguide structure 206-1 is a grounded co-planar RF waveguide (GCW) including a common ground plane 209 (shared with RF waveguide structure 206-2), and a signal line 208-1 between chip dies 204-A and 204-B. Signal line 208-1 includes signal connection 211-1 and common ground plane 209 having a ground connection 212-1 for GCW 206-1. The bottom RF waveguide structure 206-2 is a coaxial RF waveguide including a signal line 208-2 surrounded by common ground plane 209 and ground plane 210 having a ground connection 212-2 for the coaxial RF waveguide 206-2. In these examples, RF waveguide structures 206-1 and 206-2 can communicate ultra-high bandwidth RF signals as detailed in FIG. 1 regarding RF waveguide 106.

Referring to FIG. 2B, a cross sectional view of electronic package 200 of FIG. 2A taken longitudinally into silicon die chip 204-A showing a top grounded co-planar RF waveguide 206-A and a bottom coaxial grounded RF waveguide 206-B. As illustrated, common ground plane 209 is shared by RF waveguide 206-A and 206-B. For RF waveguide 206-A, signal line 208-1 is surrounded by a common ground plane 209 forming the waveguide. For RF waveguide 206-B, signal line 208-2 is surrounded by common ground plane 209 and ground plane 210 forming the waveguide. In one example, the grounded co-planar RF waveguide 206-1 and coaxial RF waveguide 206-2 can carry RF signals as direct current (DC) frequency signals, e.g., from DC to sub-Tera hertz (THz) frequencies.

Figure 2C:
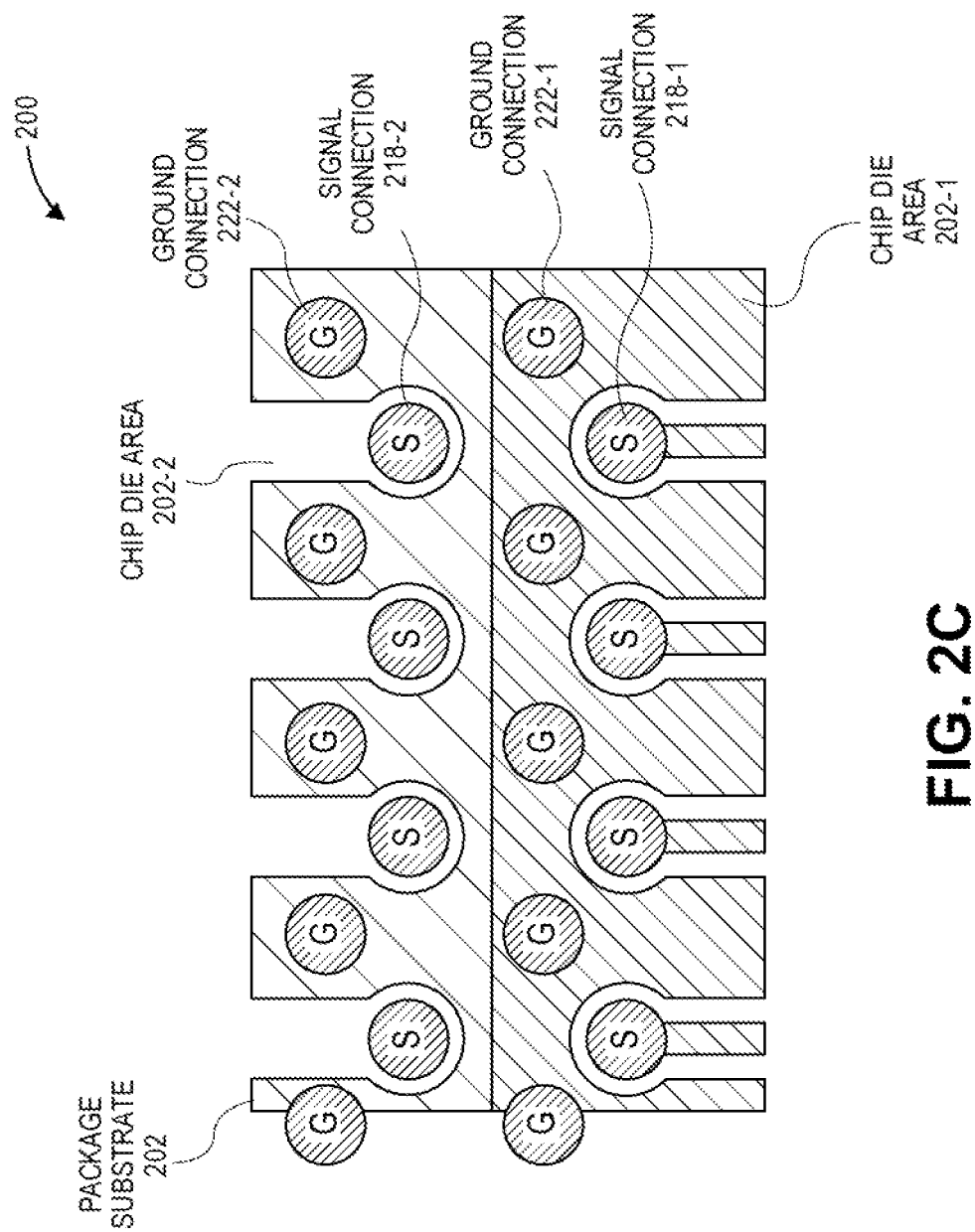
FIG. 2C shows one example of a top-view of an electronic package of FIGS. 2A and 2B showing ground and signal connections.

FIG. 2C shows one example of a top-level view of a portion of package 200 in FIGS. 2A and 2B showing signal and ground connections to interconnect to RF waveguide structures 206-1 and 206-2 in package substrate 202. In one example, package 200 includes two areas (e.g., four rows) of die-to-package interconnects or bumps "S" for signal interconnects identified as signal connections 218-1 and 218-2 and "G" for ground interconnects identified as ground connections 222-1 and 222-2 in chip die areas 202-1 and 202-2 for package substrate 202. The signal connections 218-1 and ground connections 222-1 for chip-to-die interconnect area 202-1 can connect to top metal layers for a grounded co-planar RF waveguide 206-1 and the signal connections 218-2 and ground connections 222-2 for chip-to-die area 202-2 can connect to other metal layers for a coaxial RF waveguide 206-2.

Figure 2D:
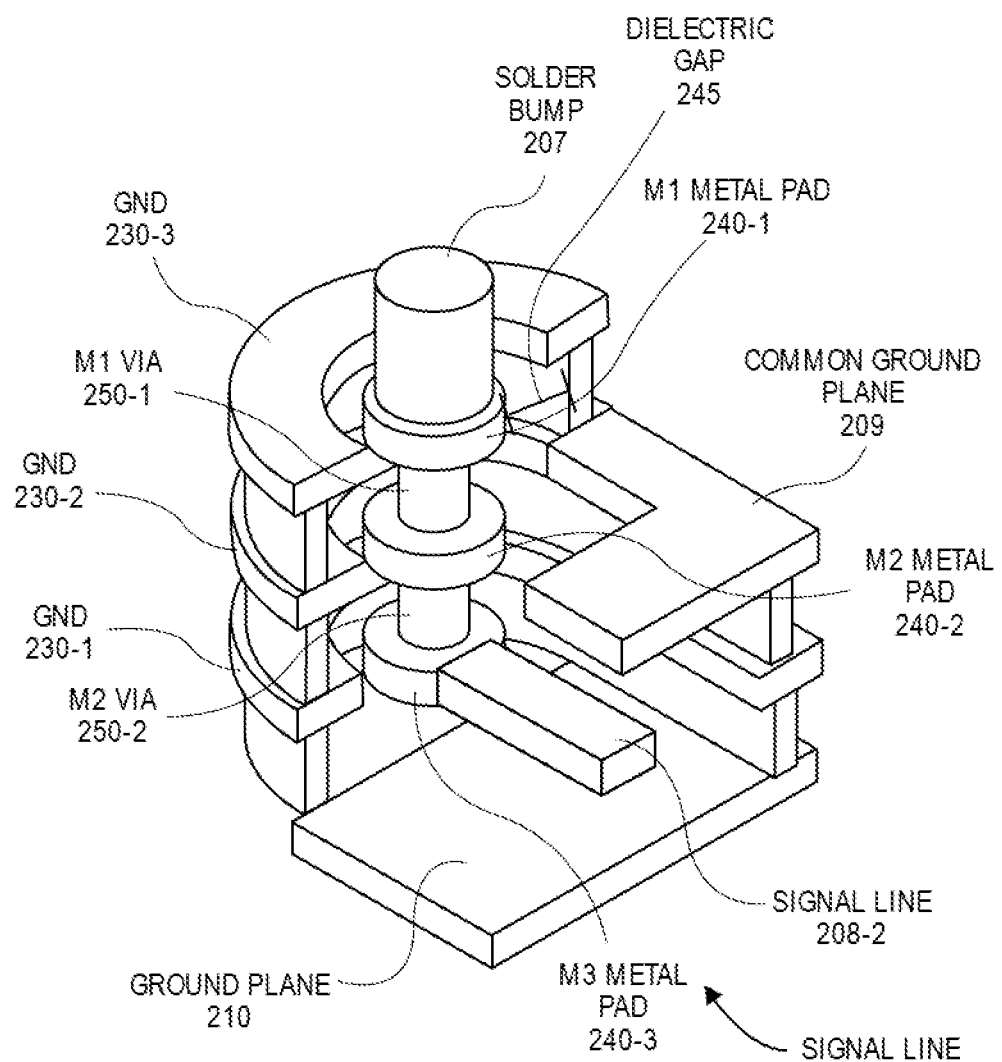
FIG. 2D depicts the exemplary three-dimensional waveguide structures of FIGS. 2A and 2B, which can be connected to signal connections and ground connections of FIG. 2C.

For example, referring to FIG. 2D, a three-dimensional depiction is shown to illustrate four metal layers forming waveguide structures and buried coaxial waveguide signal line. The metal layers form ground plane 210 and common ground plane 209 (part of ground plane 209 is not shown to show signal line 208-2), and ground connections GND 230-1, GND-2, and GND 230-3. A dielectric gap 245 is between M2 metal pad 240-2 and common ground plane 209 and GND connection 230-2. In FIG. 2D, the buried signal line 208-2 for a coaxial RF waveguide 206-2 is shown connecting to a solder bump 207. For example, signal connection 211-2 of FIG. 2A, can be represented as solder bump 207, M1 metal pad 240-1, M1 via 2501, M2 metal pad 240-2, M2 via 250-2, and M3 metal signal line pad 240-3 in FIG. 2D. In this example, ground plane 210 is shown below signal line 208-2 and common ground plane 209 is formed above signal line 208-2, which can surround signal line 208-2.

System on a Chip (SoC) Examples Using Waveguide HBI Interconnects

Figure 3:
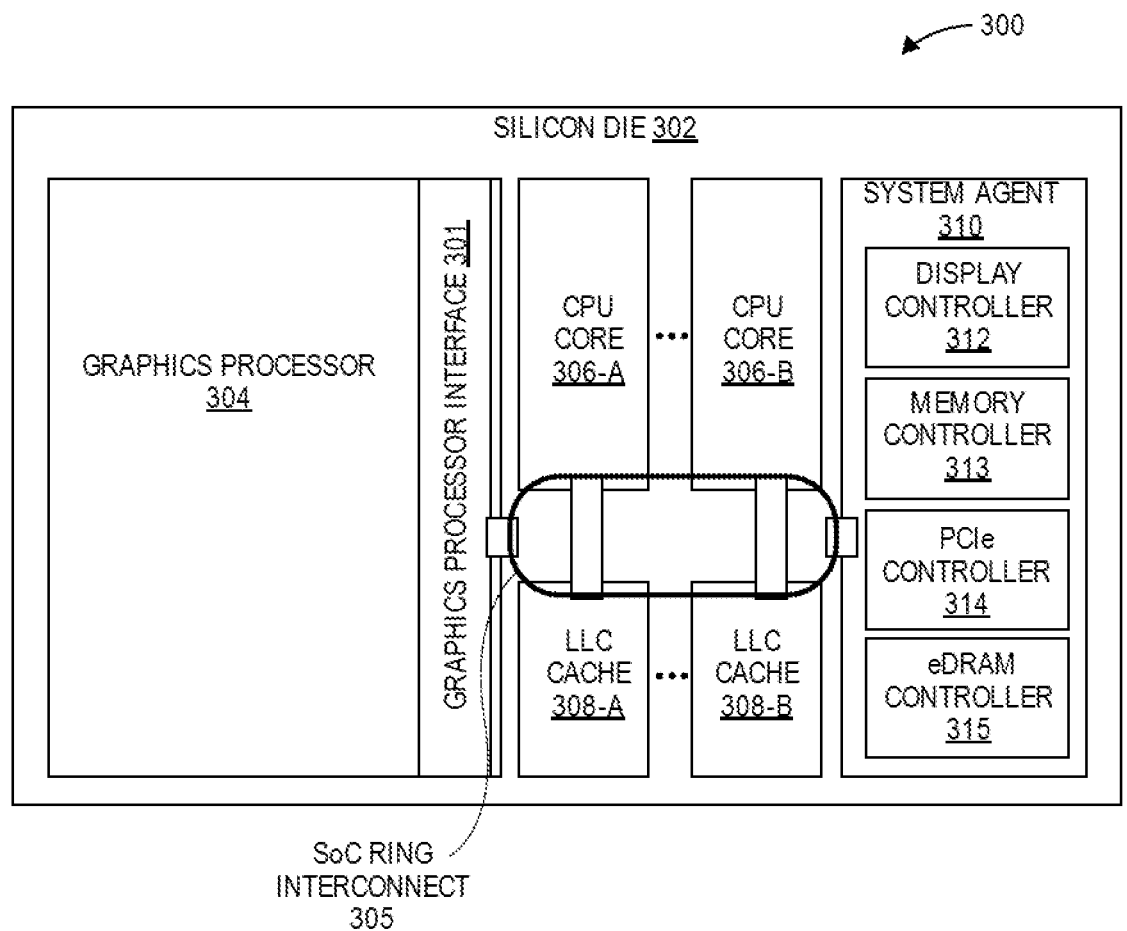
FIG. 3 is a top-level view of a generic central processing unit (CPU) silicon die showing a system on a chip (SOC) with a ring bus interconnect.
Figure 4A:
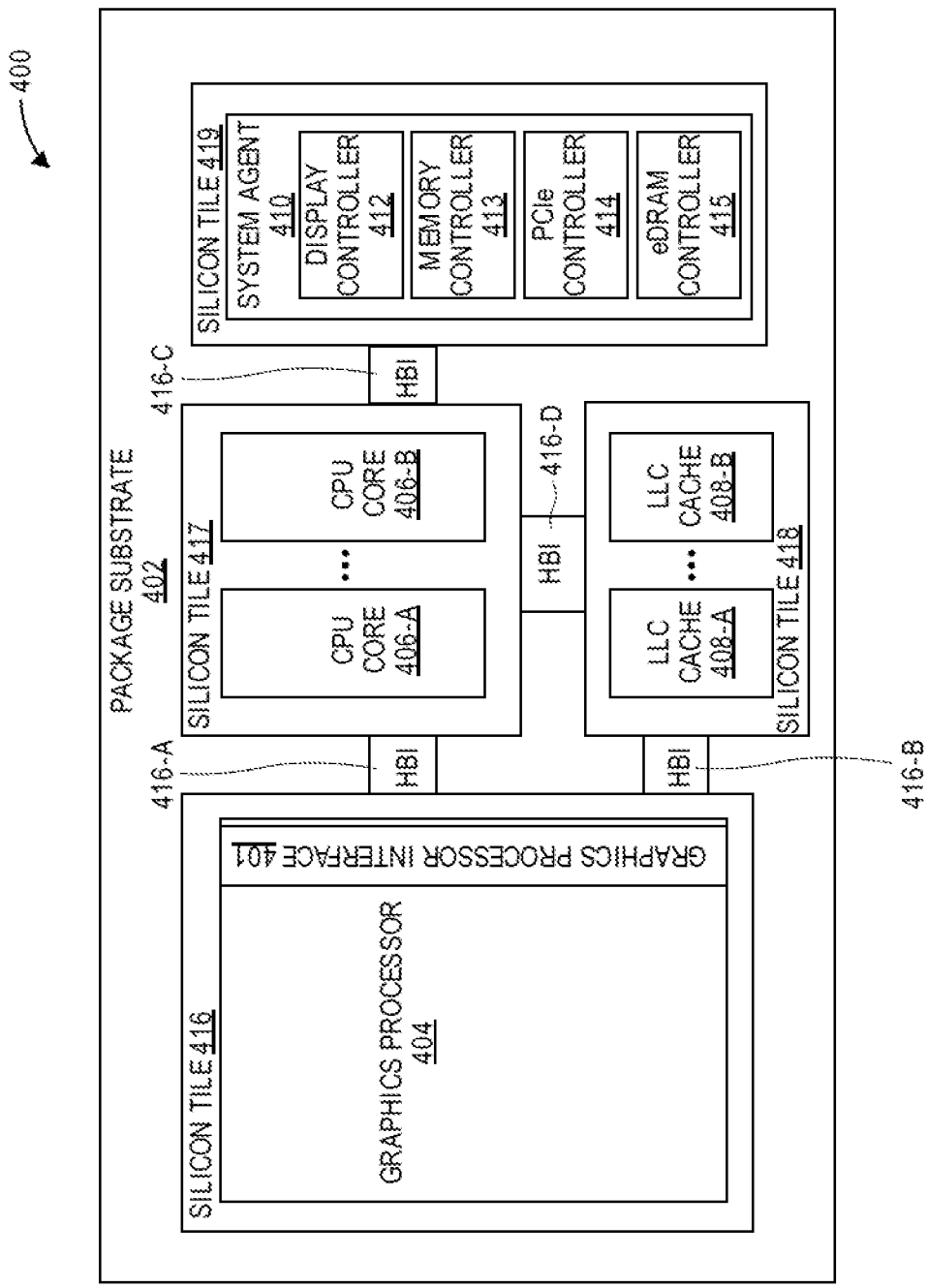
FIGS. 4A-4C are top level view examples electronic packages with SoC using high bandwidth interconnects (HBI).
Figure 4B:
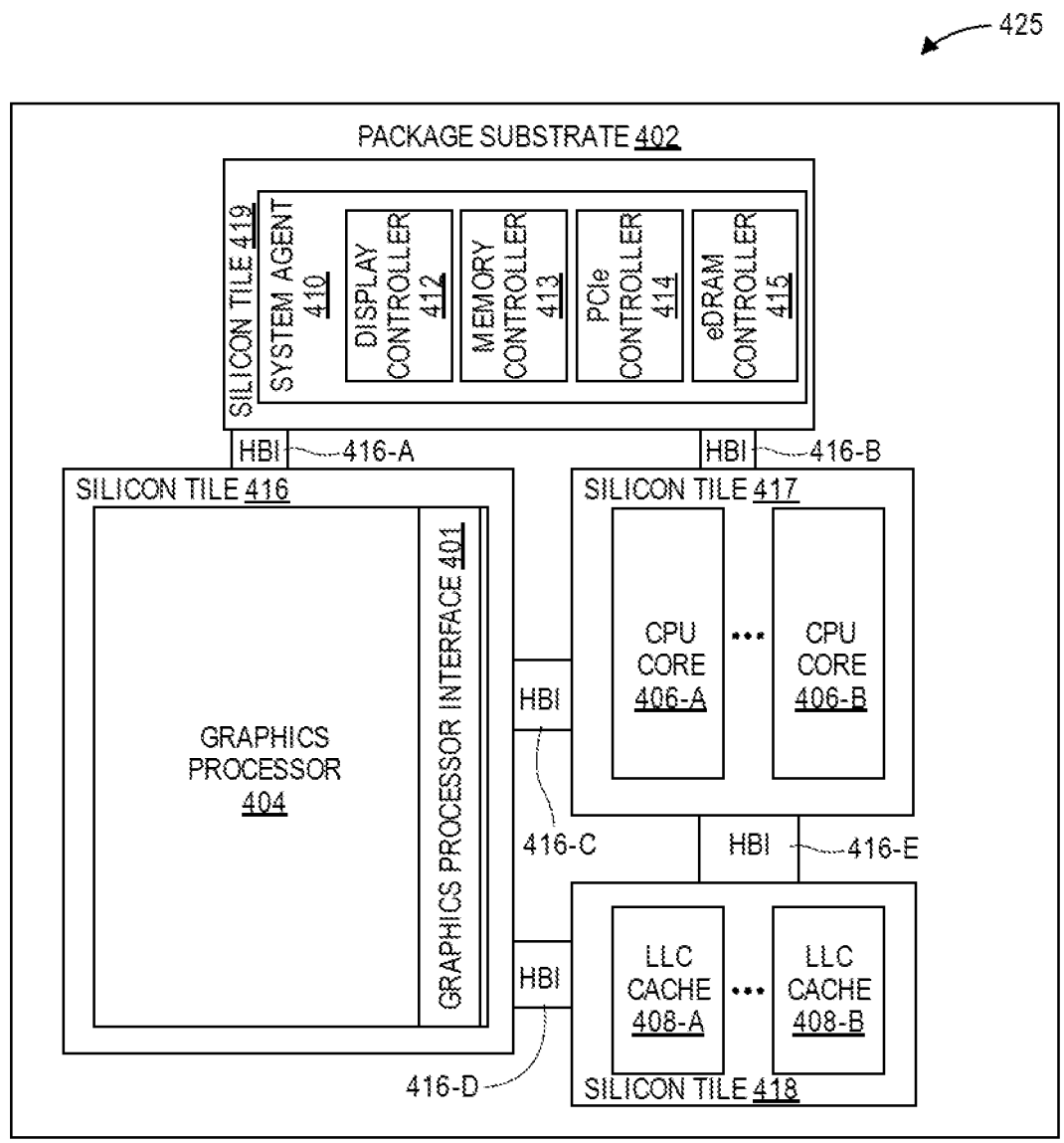
Figure 4C:
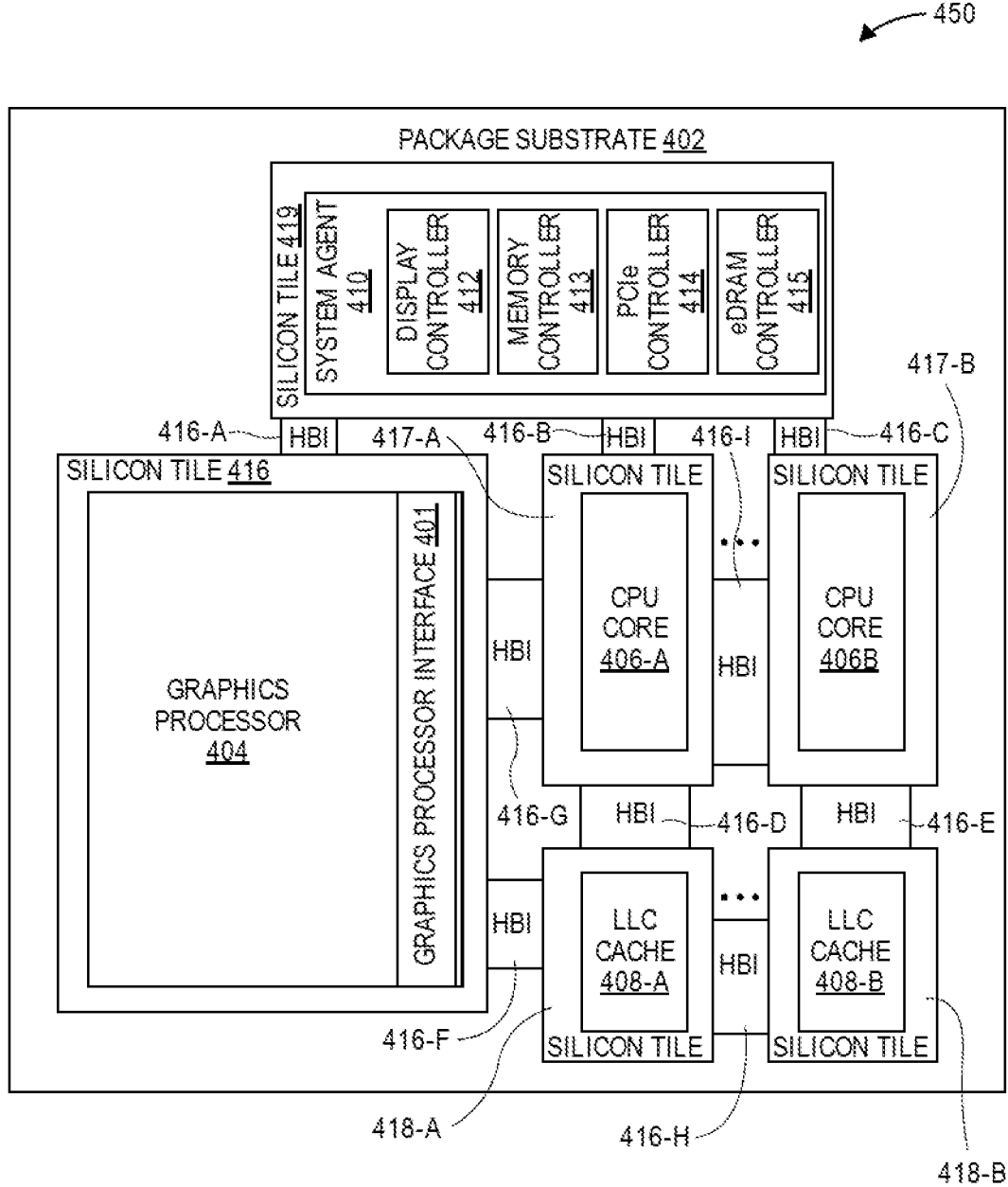
Figure 4D:
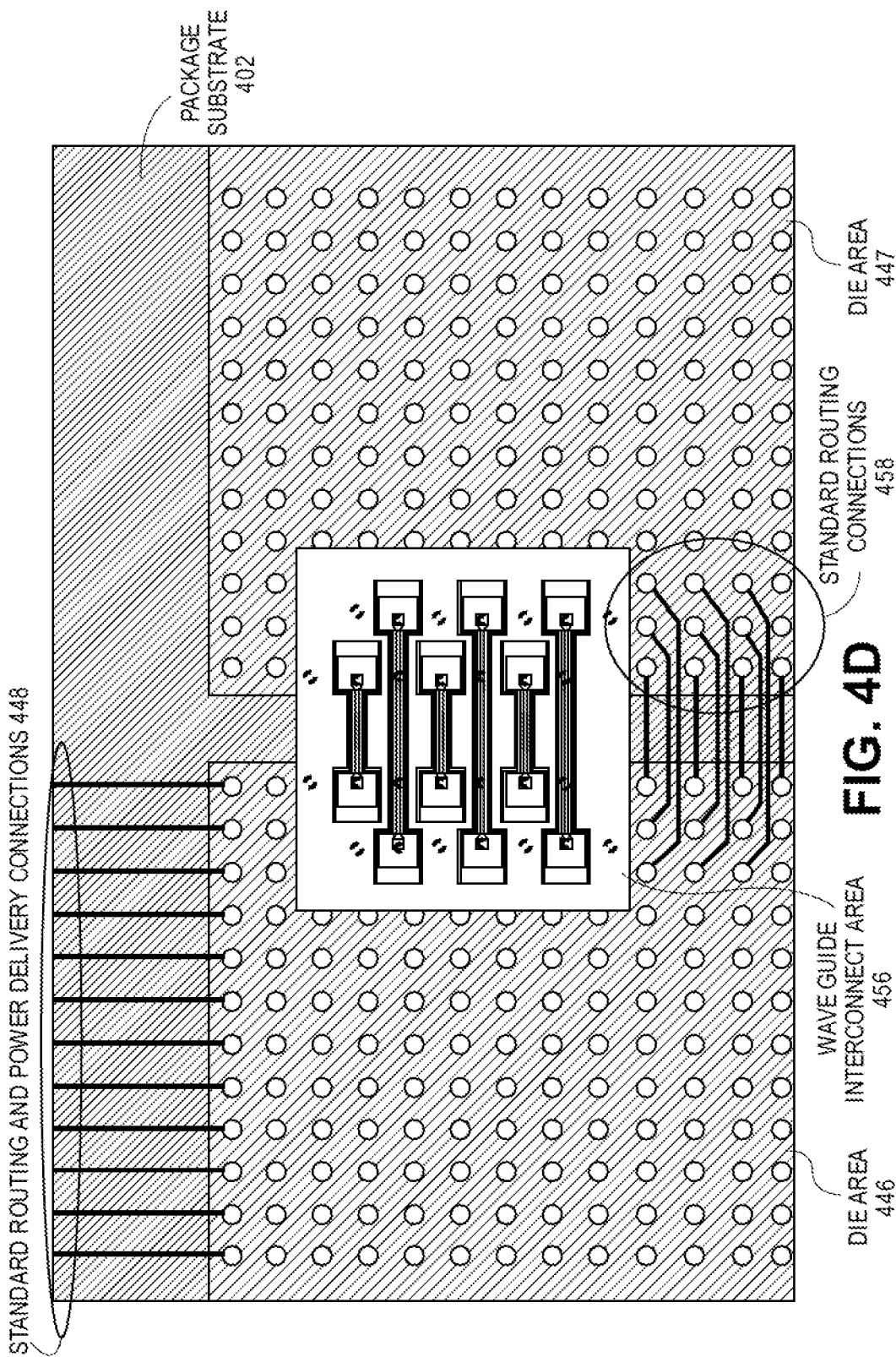
FIG. 4D is a top level view example of an electronic package with different die areas and waveguide interconnect areas.

FIG. 3 is a top-level view 300 of one example of a generic monolithic central processing unit (CPU) silicon die 302 showing a system on a chip (SoC) with a ring bus interconnect 305. Referring to FIG. 3, silicon die 302 includes a graphics processor 304 having a graphics processor interface 301 coupled to SoC ring interconnect 305. SoC ring couples and interconnects CPU cores 306-A and 306-B, LLC cache 308-A and 308-B, system agent 310 and graphics processor 304. System agent 310 includes components such as display controller 312, memory controller 313, peripheral component interconnect express (PCIe) controller 314, and express dynamic random access memory (eDRAM) controller 315, and can include other components and controllers. FIGS. 4A-4C are exemplary top level views of electronic packages with SoC using high bandwidth chip-to-chip interconnect waveguide structures identified as "HBI," which can be waveguide structures illustrated in FIGS. 1-2D. FIG. 4D is a top level view example of an electronic package with different die areas and waveguide interconnect area. The HBI can include waveguide structures described in FIGS. 1 and 2A-2D. By using in-package RF waveguides for a HBI as disclosed herein, silicon dies, chips, or tiles and components for the SoC in an electronic package can be interconnected providing ultra-high bandwidth RF signal communications for chip-to-chip communication. In these examples, silicon tiles for the SoC are shown, which can be stitched together or re-synthesized on the package using HBI in place of using a ring bus interconnect of FIG. 3.

Referring to FIG. 4A, electronic package 400 includes four silicon tiles 416, 417, 418 and 418 on or attached with package substrate 402. In this example, there are four HBI (416-A through 416-D) formed in package substrate 402 to interconnect tiles 416, 417, 418 and 418. Silicon tile 416 includes graphics processor 404 and graphics processor interface 401. HBI 416-A and 416-B interconnect silicon tile 417 and silicon tile 418 with silicon tile 416. In this way, signals and data can pass between graphics processor 404 and CPU cores 406-A and 406-B and LLC cache 408-A and 408-B. HBI 416D interconnects silicon die 417 with silicon die 418 and HBI 416-C interconnects silicon die 417 with silicon tile 419. Here, signals and data can transmitted and received between CPU cores 406-A and 406-B and LLC cache 408-A and 408-B and system agent 410.

Referring to FIG. 4B, an alternative electronic package 425 is shown including silicon tiles 416, 417, 418 and 419 on or attached to package substrate 402. In this example, there are five HBI (416-A through 416-E) formed in package substrate 402 implemented as RF waveguides to interconnect tiles 416, 417, 418 and 419. Silicon tile 416 includes graphics processor 404 and graphics processor interface 401. HBI 416-A interconnects silicon tile 416 with silicon tile 419 including a system agent 410 having a display controller 412, memory controller 413, PCIe controller 414 and eDRAM controller 415, and other components and controllers can be part of system agent 410. HBI 416-C interconnects silicon tile 416 with silicon tile 417 having CPU core 406-A and 406-B and HBI 416-D interconnects silicon tile 416 with silicon tile 418 having LLC cache 408-A and 408-B. HBI 416-E interconnects silicon tile 418 and 4107, and HBI 416-B interconnects silicon tile 417 and silicon tile 419. In this configuration, signals and data can be communicated between silicon tiles 416 through 419 and respective components by way of HBI 416-A through 416-E.

Referring to FIG. 4C, an alternative electronic package 450 is shown including silicon tiles 416, 417-A, 417-B, 418-A, 418-B and 419 on or attached with package substrate 402. In this example, there are seven HBI (416-A through 416-H) formed in package substrate 402 implemented as RF waveguides to interconnect six silicon tiles 416, 417-A, 417-B, 418-A, 418-B and 419. Silicon tile 416 includes graphics processor 404 and graphics processor interface 401. HBI 416-A interconnects silicon tile 416 with silicon tile 419 including a system agent 410 having a display controller 412, memory controller 413, PCIe controller 414 and eDRAM controller 415, which can have other components and controllers. HBI 416-G interconnects silicon tile 416 with silicon tile 417-A having CPU core 406-A, HBI 416-F interconnects silicon tile 416 with silicon tile 418-A having LLC cache 408-A. HBI 416-B interconnects silicon tile 417-A with silicon tile 419. HBI 416-C interconnects silicon tile 417-B including CPU core 406-B with silicon tile 419. HBI 416-D interconnects silicon tile 417-A with silicon tile 417-B, HBI 416-H interconnects silicon tile 418-A with silicon tile 418-B. HBI 416-D and 416-E interconnect silicon tiles 418-A and 418-B with silicon tiles 417-A and 417-B, respectively. In this configuration, signals and data can pass between silicon tiles 416 through 419 and respective components by way of HBI 416-A through 416-H.

In the example electronic packages 200, 225 and 250 disclosed in FIGS. 4A, 4B and 4C, the HBI interconnects between different die tiles or blocks can be tailored for bandwidth requirements for each block, need not be uniform in structure or design. In some examples, different block-to-block communication may require different bandwidths, thus some areas of the silicon die or SOC may a higher or lower number of RF waveguides guide interconnects or HBIs requiring more or less area of the package substrate 402 as shown in FIG. 4C for HBI 416-A through 416-H. In one example, the electronic packages 200, 225 and 250 of FIGS. 4A-4C can have an I/O density 5-20 IO/mm (mm-width), but not so limited.

FIG. 4D is a top level view example of an electronic package 470 with different die areas 446 and 447 and waveguide interconnect area 456. In this example, top metal lines and connections are shown having a waveguide interconnect area 456 to show connections in that area between die areas 446 and 447. This area includes RF waveguide structures disclosed herein formed in package substrate 402 interconnecting and coupling various connections in die area 446 with various connections in die area 447. Electronic package 470 can also have standard routing and power delivery connections 448 and standard routing connections 458 between die areas 446 and 447 as well connections using waveguide interconnects.

Stacked Dies Examples Using Waveguide Interconnects

Figure 5A:
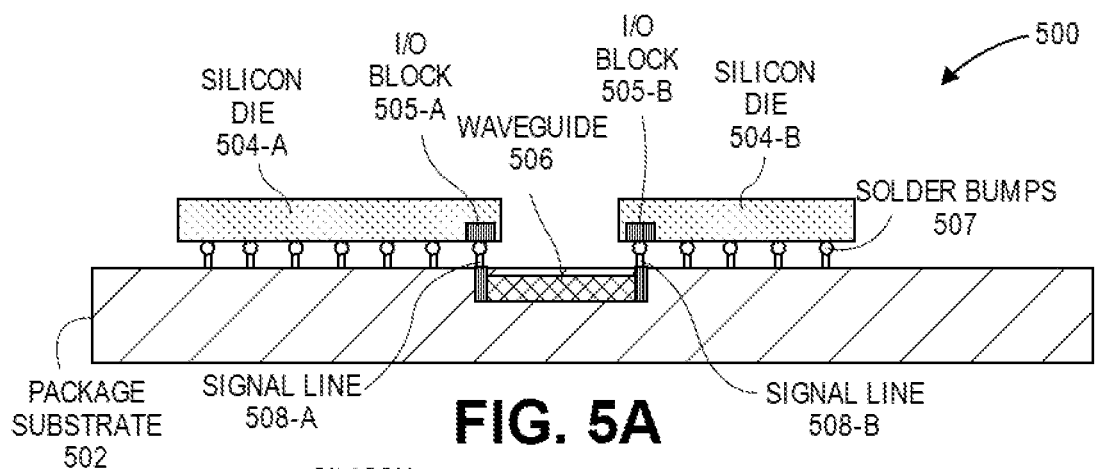
FIGS. 5A-5C are cross-sectional view examples of electronic packages for stacking silicon dies vertically and having RF waveguide interconnects or HBI.
Figure 5B:
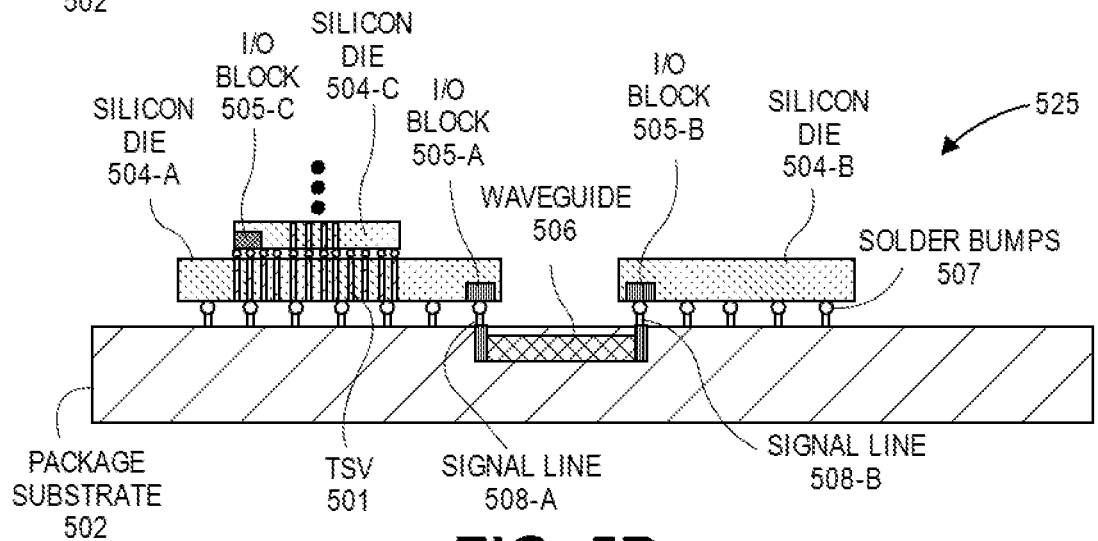
Figure 5C:
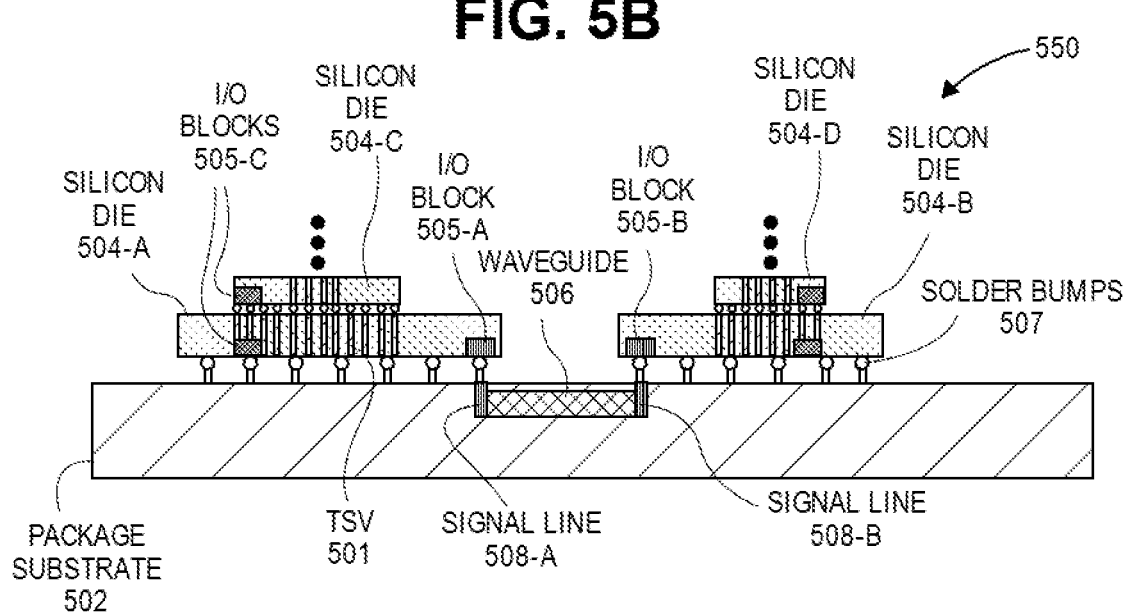

FIGS. 5A-5C are cross-sectional view examples of electronic packages 500, 525 and 550 for stacking a number of silicon dies vertically and having RF waveguide interconnects HBI. Referring to FIG. 5A, electronic package 500 is similar to electronic package 100 of FIG. 1. Electronic package 500 includes a package substrate 502 with a waveguide 506 which can be an in-package RF waveguide providing HBI. Silicon dies 504-A and 504-B are attached with package substrate 502 by way of solder bumps 507. Silicon dies 504-A and 504-B include corresponding input/output (I/O) blocks 505-A and 505-B coupled to waveguide 506 connected to I/O blocks 505-A and 505-B by way of signal lines 508-A and 508-B for waveguide 506. In one example, I/O blocks 505-A and 505-B are configured to provide ultra-high bandwidth RF signal communication using high frequency carrier signals, e.g., 1-200 GHz carrier signals, modulating any number of signals for any number of data channels using standard modulation schemes (e.g., QAM-4) to and from RF waveguide 506. In this example, waveguide 506 interconnects silicon dies 504-A and 504-B and communicates ultra-high bandwidth RF signals between silicon dies 504-A and 504-B using signal lines 508-A and 508-B.

Referring to FIG. 5B, a silicon die 504-C is stacked on silicon die 504A having I/O block 505-C connections and through silicon via (TSV) connections 501. In this Example, silicon die 504-C can be interconnected with silicon die 504-B through TSV 501 and waveguide 506. In other examples, silicon die 504-C can be interconnected to another waveguide (not shown which may extend longitudinally into package substrate 502) and connected to I/O block connections 505-C. For example, I/O block connections 505-C in silicon die 504-C and 504-A can be connected and interconnected with a waveguide to silicon die 504-B.

Referring to FIG. 5C, in another example, a silicon die 504-C is stacked on silicon die 504-A and a silicon die 504-D is stacked on silicon die 504-B. Waveguide 506 can interconnect stacked silicon dies 504-A and 504-C with stacked silicon dies 504-B and 504-D. Referring to FIG. 5B, a silicon die 504-C is stacked on silicon die 504A having I/O block 505-C connections and through silicon via (TSV) connections 501. In this example, silicon die 504-C can be interconnected with silicon die 504-B through waveguide 506 and TSV 501. In other examples, silicon die 504-C can be interconnected to another waveguide (not shown which may extend longitudinally into package substrate 502) and connected to I/O block connections 505-C. For example, I/O block connections 505-C in silicon die 504-C and 504-A can be connected and interconnected with a waveguide to silicon die 504-B.

In operation, for example, referring to FIG. 5B, at I/O block 505-C, for the silicon die 505-C stacked on silicon die 505-A, silicon die 505-C can communicate ultra-high bandwidth RF signals that pass through a TSV connection 501 to silicon die 505-A which passes the signals to I/O block 505-A and to waveguide 506. Waveguide 506 can pass the signals to silicon die 504-B through I/O block 505-B and solder bumps 507. Likewise, silicon die 504-B can transmit signals to silicon die 504-C stacked on silicon die 504-A in the same way. Referring to FIG. 5C, in the same way, silicon dies 504-C and 504-D can communicate ultra-high bandwidth RF signals though lower silicon dies using TSV connections and I/O blocks passed on by waveguide 506. In the examples. In the examples of FIGS. 5B and 5C, a three-dimensional stack and vertical connectivity can be achieved from a lower silicon die to any number of upper silicon dies using TSV connections and associated HBI waveguide interconnect densities, speeds, and overall bandwidth. The waveguide 506 interconnects allow the stacked silicon dies to be connected by a HBI. The bottom dies, e.g., silicon die 504-A and 504-B can be configured with necessary logic and circuitry to communicate ultra-high bandwidth RF signals.

Figure 6A:
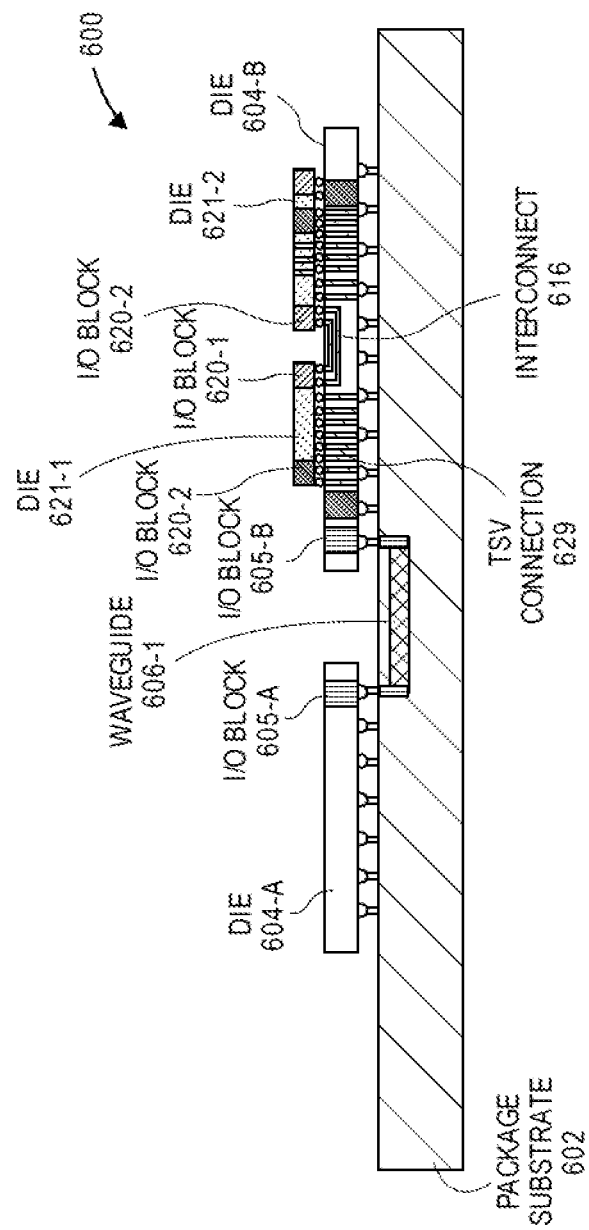
FIGS. 6A-6C are cross-sectional view examples of electronic packages for stacking silicon dies vertically and having RF waveguide interconnects or HBI in package substrates and silicon dies.
Figure 6B:
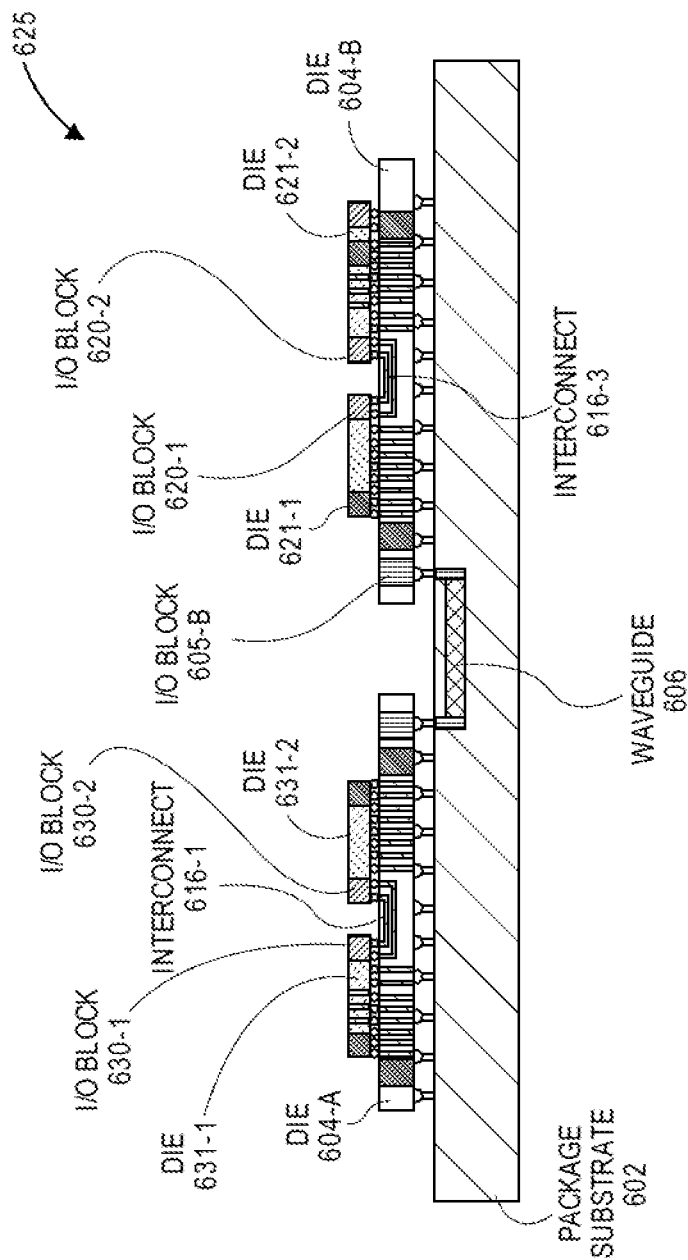
Figure 6C:
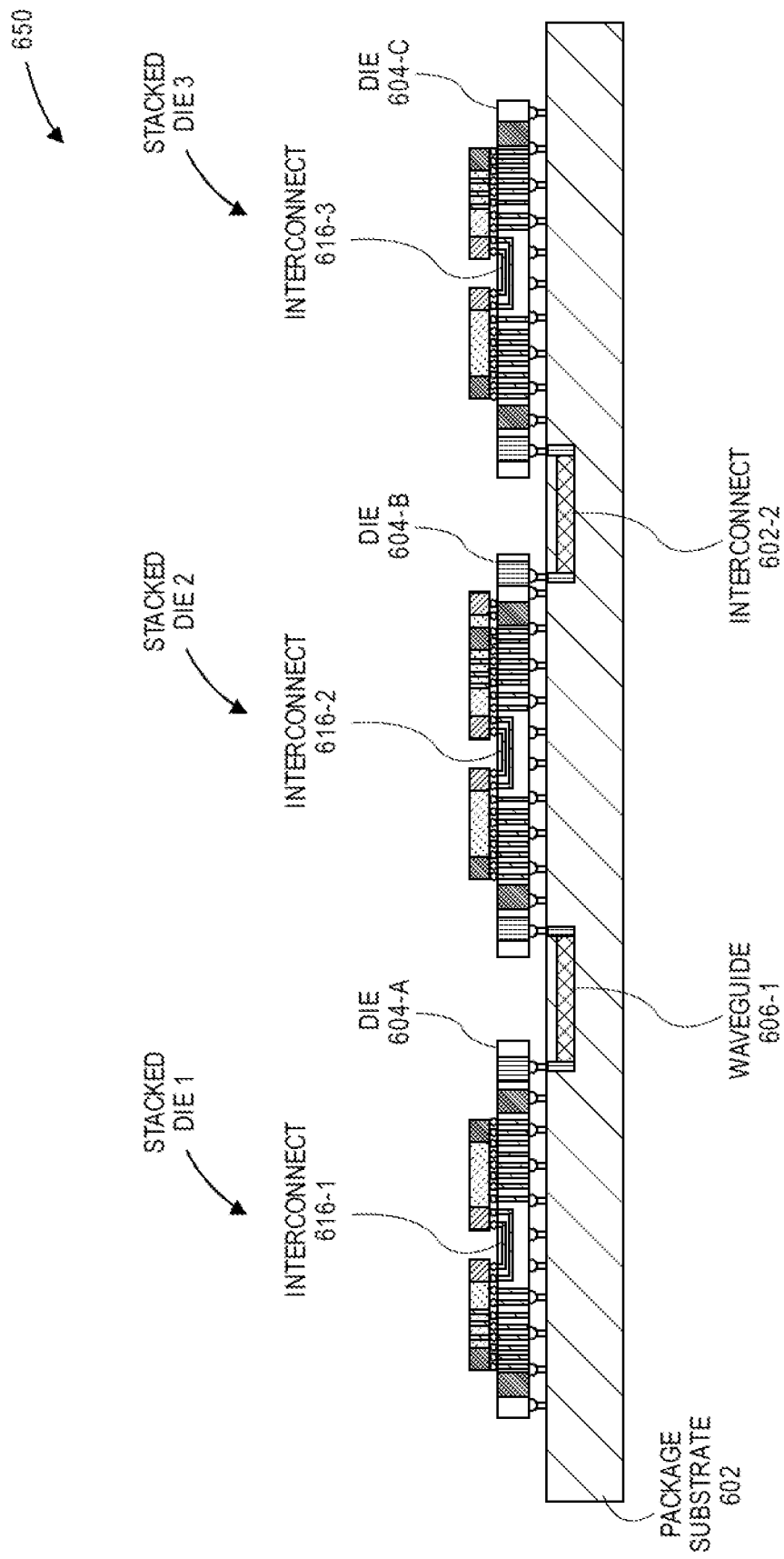

FIGS. 6A-6C illustrate additional examples of cross-sectional view examples of electronic packages 600, 625, and 650 for stacking silicon dies vertically and having RF waveguide interconnects or HBIs in package substrates. In the following examples, stacked dies or tiles can be synthesized and interconnected using interposers and the stacked dies or tiles can then be interconnected using the in-package RF waveguides or HBIs disclosed herein. The package substrate can support stacking or integration of smaller dies or tiles on top of larger bottom dies or tiles. In some examples, the stacked dies or tiles can be used for individual cores of a CPU or processor. Using the smaller dies or tiles stacked on other dies or tiles provide a larger system or sub-system (e.g., a multi core/sub-system). By being laterally interconnected using RF waveguides, the bottom die or tile in stacked dies or tiles can be interconnected through the package substrate in providing ultra-high bandwidth RF signal communication between stacked dies or tiles on a package substrate.

Referring to FIG. 6A, electronic package 600 includes die 604-A interconnected with die 604-B by waveguide 606-1 formed in package substrate 602. Two smaller dies (dies 621-1 and 621-2) are stacked on die 604-B. Dies 621-1 is interconnected with die 621-2 by interconnect 616, which can be a standard bridge connection or interposer connection. In this example, die 604-A can be coupled to dies 621-1 and 621-2 stacked on die 604-B through IB blocks 605-A, 605-B, 620-1 and 620-2, which can communicate ultra-high bandwidth RF signals between dies. Stacked dies 621-1 and 621-2 and die 604-B can have through-silicon via (TSV) connections, e.g., TSV connection 629, to bottom die 604-B to top dies 621-1 and 621-2. In some examples, the TSV connections can be standard packaging connections for power delivery or lower bandwidth I/O connections to board or slower memory.

Referring to FIG. 6B, electronic package 625 is similar to electronic package 600 of FIG. 6A, except that two smaller dies 631-1 and 631-2 are stacked on die 604-A having interconnects 616-1 and 616-2, and the stacked dies can be interconnected by way of waveguide 606. In this example, smaller dies 631-1 and 631-2 stacked on die 604-A can communicate ultra-high bandwidth RF signals between smaller dies 621-1 and 621-2 stacked on die 604-B through waveguide 606 and respective I/O blocks. Referring to FIG. 6C, Stacked Die 1 and Stacked Die 2 is the same as electronic package 650 of FIG. 6B and operates in the same way, but with an additional Stacked Die 3. Stacked Die 1 includes interconnect 616-1 connecting smaller dies stacked on die 604-A and Stacked die 2 includes interconnect 616-2 connecting smaller dies stacked on die 604-B. Stacked Die 1 and Stacked Die 2 can communicate ultra-high bandwidth RF signals through waveguide 606-1, which can be RF waveguide structures disclosed herein. Stacked Die 3 includes interconnect 613-3 to interconnect two smaller stacked dies on die 604-C. In one example, Stacked Die 3 and Stacked Die 2 can communicate ultra-high bandwidth RF signals through waveguide 602-2, which can also be a RF waveguide structure as disclosed herein. In another example, Stacked Die 2 can communicate with RF signals with Stacked Die 1 using a different RF waveguide formed in other parts of substrate 602. In this example, any of the smaller stacked dies on dies 604-A, 604-B, and 604-C can be coupled and communicate ultra-high bandwidth RF signals using waveguides 606-1 through 606-2 and respective I/O blocks.

In the above examples of FIGS. 6A-6C, bottom dies, e.g., dies 604-A through 604-C, serve to connect one system or sub-system of smaller dies or tiles stacked on top, e.g., Stacked Die 1 through 3. The bottom die can contained the necessary circuitry and connections for waveguides to interconnect the smaller dies or tiles formed above. In this way, dies or tiles can be built or stacked with an overall very large computational capability, while using simple building blocks and optimal silicon node technology. Furthermore, in these examples, RF waveguides formed in the package substrate can provide optimal interconnections between dies or tiles using small bump pitches achieving high bandwidths and data rates.

Forming RF Waveguide Interconnects Using Standard Semiconductor Processing

Figure 7A:
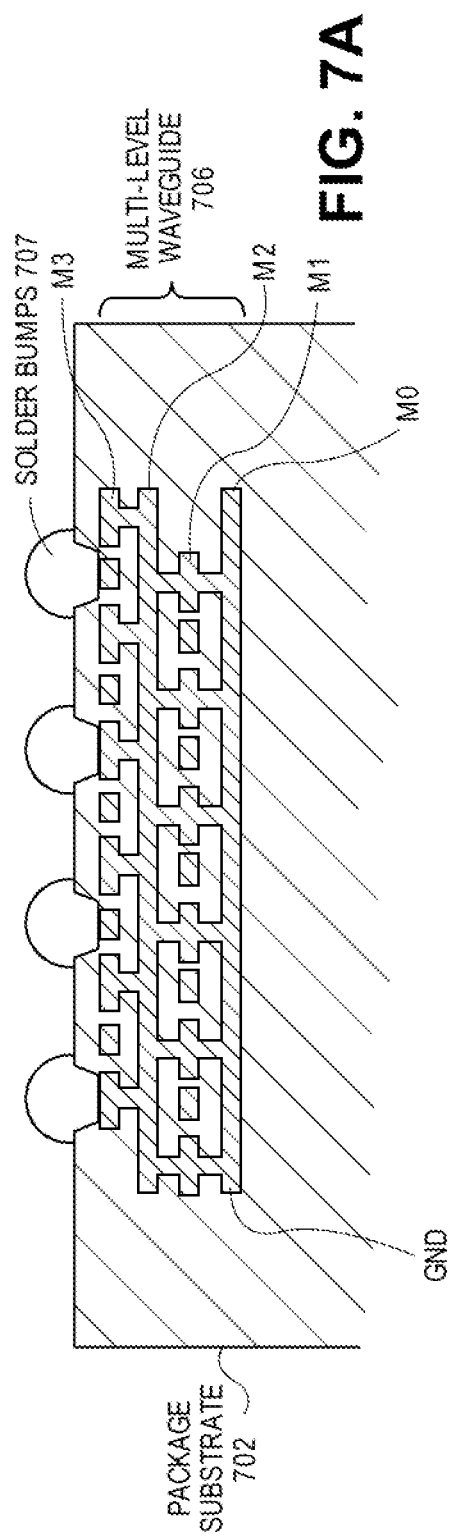
FIGS. 7A-7B illustrate multiple layers forming exemplary waveguide structures for an electronic package.
Figure 7B:
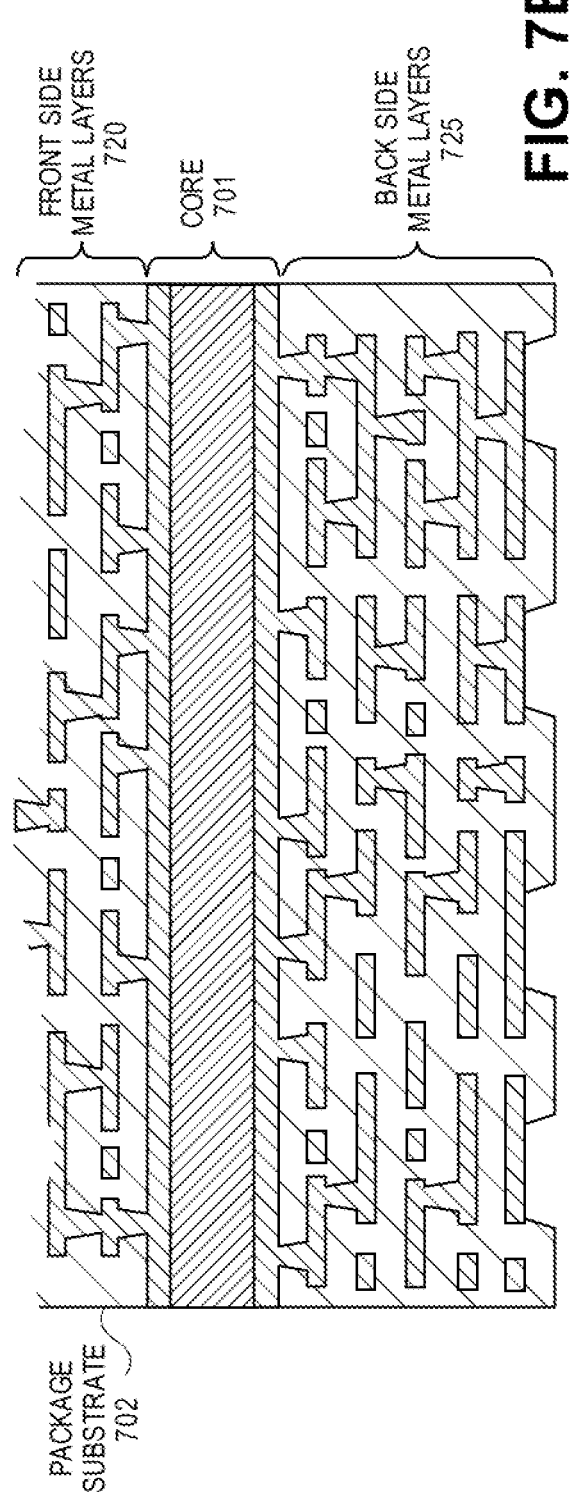

FIGS. 7A-7B illustrate multiple layers forming exemplary waveguide structures for an electronic package. Referring to FIG. 7A, an exemplary structure is shown having package substrate 702 and, in one example, is an organic substrate. Formed in package substrate 702 is a multi-level waveguide having multiple metal layers M0, M1, M2 and M3. In one example, M3 and M2 can be used to form a top grounded co-planar RF waveguide and M0 and M1 can be used to form a bottom coaxial RF waveguide. These metal layers M0, M1, M2 and M3 can be formed using standard semiconductor lithography and metal layering techniques and connections made using standard via connections. As shown, because the multi-level waveguide 706 forms connections to solder bumps 707 in package substrate 702, solder bump pitch can be compact and less area used on top of package substrate 702 for interconnections thereby decreasing I/O densities for electronic packaging. Referring to FIG. 7B, substrate 702 can have a core 701 where first side metal layers 720 and back side metal layers 725 can also be formed. These first side metal layers 720 and back side metal layers 725 can be used to make multi-level RF waveguide structures on both side of core 701.

In other examples, the waveguide structures can have more than two levels. In these two-level examples, the top level is a grounded co-planar wave guide and the bottom level is a coaxial waveguide due in part because a common ground plane can be shared in this configuration. In some examples, 3 metal layers and one ground metal layer is sued to form a 2-level waveguide structure. The bottom ground metal layer can also be shared with top ground plane in another level as well. Thus, adding levels to the multi-level waveguide structure can be achieved by adding two metal layers.

Figure 7C:
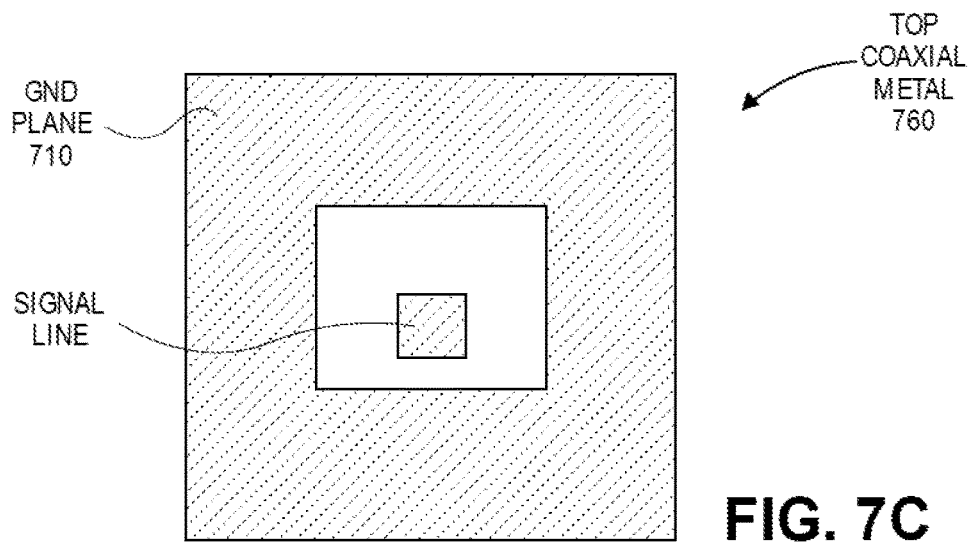
FIG. 7C-7E illustrate exemplary top level view of metal lines used for connecting RF waveguides formed in a package substrate.
Figure 7D:
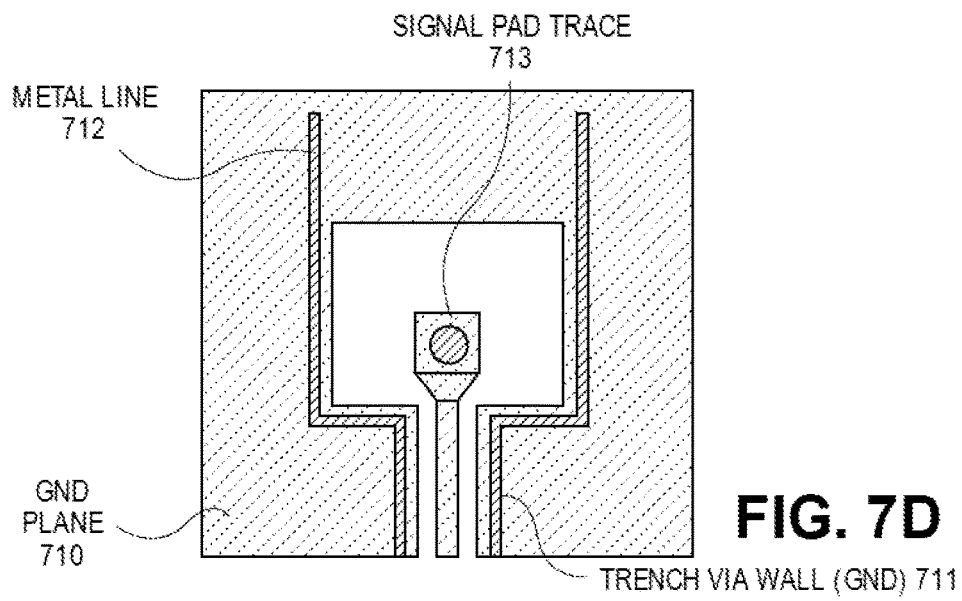
Figure 7E:
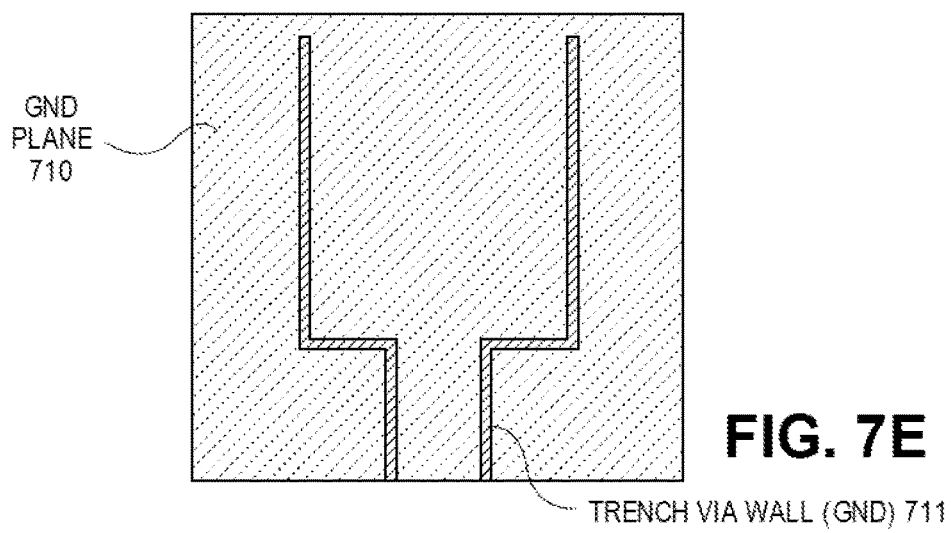

FIG. 7C-7E illustrate exemplary top level view of metal lines used for connecting to a RF waveguide formed in a package substrate. In the following examples, standard metal layering techniques can be used to connect top metal lines to multi-level RF waveguide structures formed in a package substrate as shown, e.g., in FIGS. 7A-7B. In the example of FIGS. 7C-7E, exemplary top metal lines are shown connecting to, e.g., a coaxial RF waveguide formed, in a package substrate. For example, in FIG. 7C, top coaxial metal 760 is shown with signal line 708 surrounded by GND plane 710. In FIG. 7D, a middle layer metal line 712-1 is shown to connect to a middle layer of a multi-layer waveguide structure along with signal pad trace 713 and trench via wall (GND) 711-1 are added. And in FIG. 7E, GND plane 710 and trench via wall (GND) 711 as well as bottom layer metal line 712-2 connecting to a bottom metal layer of a multi-level waveguide structure.

Exemplary Operation Using In-Package RF Waveguides

Figure 8:
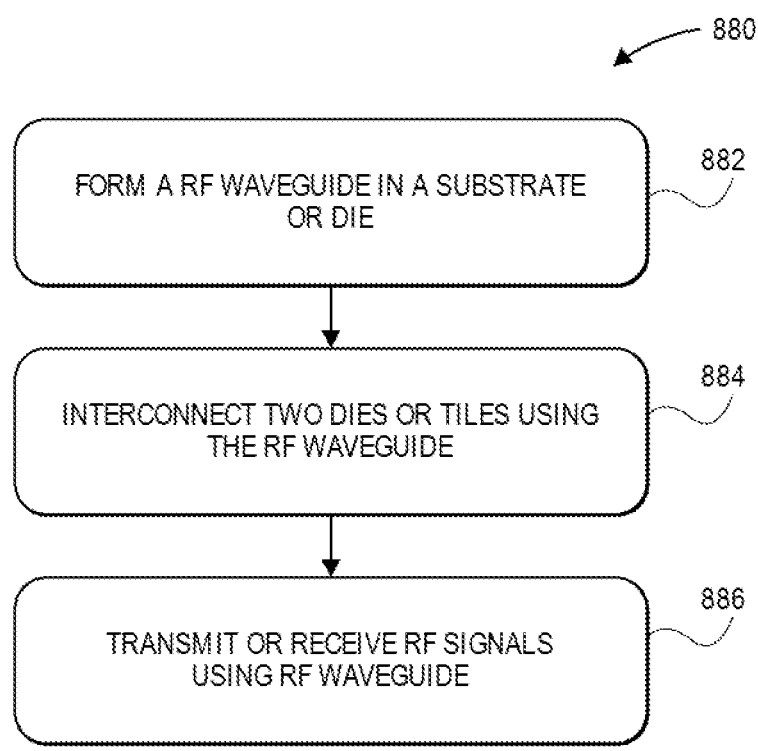
FIG. 8 illustrates an exemplary operation for using in-package RF waveguides.

FIG. 8 illustrates an exemplary operation 800 using in-package RF waveguides. At operation 802, in one example, a RF waveguide is formed in a package substrate. For example, RF waveguide 106 can be formed in package substrate 102 shown in FIG. 1. In another example, RF waveguide structures 206-1 and 206-2 can be formed in package substrate 202 shown in FIGS. 2A-2D. In other examples, HBI interconnects as RF waveguides shown in FIGS. 4A-4D can be formed in package substrates. In other examples, RF waveguide 506 can be formed in package substrate 502 shown in FIGS. 5A-5C or RF waveguide 606 can be formed in package substrate 602 shown in FIGS. 6A-6C. At operation 804, in one example, two dies or tiles are interconnected using the RF waveguide. For example, dies or tiles can be interconnected using RF waveguide structures and interconnects shown in FIGS. 1-7E. At operation 806, RF signals are transmitted or received using the RF waveguide. For example, interconnected dies or tiles or interconnected stacked dies or tiles can communicate ultra-high bandwidth RF signals using the RF waveguide structures and interconnects shown in FIGS. 1-7E.

Computer System Example Using In-Package RF Waveguides

Figure 9:
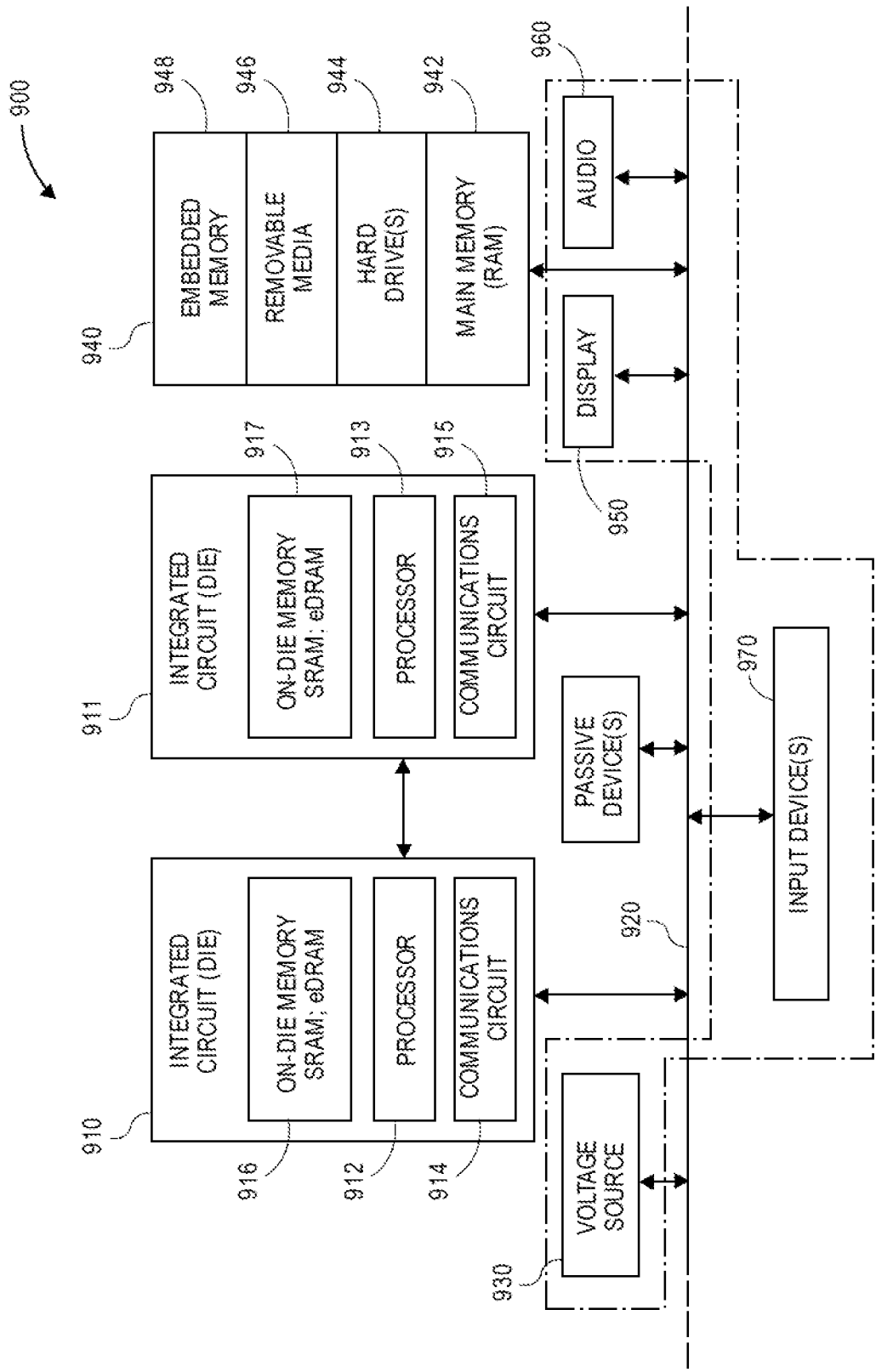
FIG. 9 is a schematic of an exemplary computer system in which in-package RF waveguides can be used.

FIG. 9 is a schematic of an exemplary computer system 900 in which in-package RF waveguides can be used. As shown, computer system 900 (also referred to as electronic system 900) can include and utilize integrated circuit (die), which can be electronic packages, having in-package RF waveguides and HBI according to any of the examples described and disclosed in FIGS. 1-9. Examples of computer system 900 include a mobile device such as a netbook computer or a wireless smart phone, a desktop computer, a hand-held reader, a server system, or a supercomputer or high-performance computing system.

In one example, electronic system 900 is a computer system that includes a system bus 920 to electrically couple the various components of electronic system 900. System bus 920 can be a single bus or any combination of busses according to various embodiments. Electronic system 900 includes a voltage source 930 that provides power to the integrated circuit 910. In some examples, voltage source 930 supplies current to integrated circuit 910 through system bus 920.

Integrated circuit 910 is electrically coupled to system bus 920 and includes any circuit, or combination of circuits on one or more silicon dies or tiles. In one example, integrated circuit 910 includes a processor 912 that can be of any type. As used herein, processor 912 may mean any type of circuit such as, but not limited to, a microprocessor, a microcontroller, a graphics processor, a digital signal processor, CPU or another processor. In one example, integrated circuit 910 includes RF waveguides disclosed herein to interconnect silicon dies or tiles. In one example, SRAM embodiments are found in memory caches of the processor. Other types of circuits that can be included in integrated circuit 910 are a custom circuit or an application-specific integrated circuit (ASIC), such as communications circuit 914 for use in wireless devices such as cellular telephones, smart phones, pagers, portable computers, two-way radios, and similar electronic systems, or a communications circuit for servers. In one example, integrated circuit 910 includes on-die memory 916 such as static random-access memory (SRAM). In another example, integrated circuit 910 includes embedded on-die memory 916 such as embedded dynamic random-access memory (eDRAM). In one example, integrated circuit 910 is complemented with a subsequent integrated circuit 911. Useful examples include a dual processor 913 and a dual communications circuit 915 and dual on-die memory 917 such as SRAM. In one example, dual integrated circuit 910 includes embedded on-die memory 917 such as eDRAM.

In one example, electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In one example, electronic system 900 also includes a display device 950, and audio output 960. In one example, electronic system 900 includes an input device such as input device(s) 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

As shown herein, integrated circuit 910 can be implemented in a number of different embodiments using RF waveguides and HBI, e.g., as shown in FIGS. 1-7B, for an electronic system or a computer system. The elements, materials, geometries, dimensions, and sequence of operations can all be varied to suit particular I/O coupling requirements including array contact count, array contact configuration for a microelectronic die embedded in a processor mounting substrate according to any of the several disclosed RF waveguides interconnects or HBI. A foundation substrate may be included, as represented by the dashed line of FIG. 9. Passive devices may also be included, as is also depicted in FIG. 9.

Examples and embodiments of the present include in-package RF waveguides as high bandwidth chip-to-chip interconnects and methods for using the same.

One example is an electronic package including a package substrate, first and second dies or tiles, and a radio frequency (RF) waveguide. The first silicon die or tile and a second silicon die or tile are attached to the package substrate. The RF waveguide is formed in the package substrate interconnecting the first silicon die or tile with the second silicon die or tile.

In one example, the RF waveguide is to communicate ultra-high bandwidth RF signals between the first silicon die or tile and the second silicon die or tile.

In one example, the first silicon die or tile includes an input/output (I/O) block and the second silicon die or tile includes an I/O block, each I/O block is a broadband transceiver for RF signals and to up and down convert frequencies of the RF signals.

In one example, the RF waveguide is coupled to the I/O block of the first silicon die or tile and the I/O block of the second silicon die or tile.

One example is an electronic package including a package substrate, first and second silicon chips, and a multi-layer RF waveguide structure. The first silicon chip and the second silicon chip are attached to the package substrate. The multi-layer RF waveguide structure is formed in the package substrate interconnecting the first silicon chip and second silicon chip.

In one example, the multi-layer RF waveguide structure includes a first RF waveguide and a second RF waveguide interconnecting the first silicon chip and the second silicon chip.

In one example, the first RF waveguide is a grounded co-planar RF waveguide and the second RF waveguide is a coaxial waveguide.

In one example, the first RF waveguide and the second RF waveguide share a common ground plane.

In one example, the first RF waveguide and the second RF waveguide include a signal line to communicate ultra-high bandwidth RF signals between the first silicon chip and second silicon chip.

One example is a device including a substrate, first and second stacked dies, and a radio frequency (RF) waveguide. The first stacked die includes a plurality of dies attached to the substrate. The second stacked die includes a plurality of dies attached to the substrate. The RF waveguide is formed in the substrate to interconnect the first stacked die and the second stacked die.

In one example, the devices includes a third stacked die including a plurality of dies attached to the substrate, and a second RF waveguide formed in the substrate. The second RF waveguide is to interconnect the third stacked die with at least one of the first stacked die or second stacked die.

In one example, the first and second RF waveguides are to communicate ultra-high bandwidth RF signals.

One example is a computing device including input and output devices; and at least one integrated circuit die. The integrated circuit die includes a substrate and at least two die areas interconnected by a radio frequency (RF) waveguide formed in the substrate.

In one example, the RF waveguide is to communicate ultra-high bandwidth RF signals between the at least two die areas.

In one example, each of the at least two die areas include an input/output (I/O) block, each I/O block is a broadband transceiver for RF signals and to up and down convert frequencies of the RF signals.

In one example, the RF waveguide is coupled to each I/O block of the at least two die areas.

One example includes a method for electronic package comprising transmitting radio frequency (RF) signals to a RF waveguide formed in a substrate of the electronic package from a first tile or die in the electronic package, and receiving the transmitted RF signal from the RF waveguide formed in the substrate of the electronic package by a second tile or die in the electronic package.

In one example, the RF signals are ultra-high bandwidth RF signals.

In one example, transmitting RF signals includes modulating the RF signals using a high frequency carrier signal.

In one example, modulating the RF signals uses a quadrature amplitude modulation (QAM) scheme.

The foregoing description and drawings are to be regarded in an illustrative rather than a restrictive sense. Various modifications and changes may be made to the embodiments and examples described and disclosed herein without departing from the broader spirit and scope of the invention as set forth in the appended claims.

What is claimed is:

1. An electronic package comprising:
   a package substrate;
   a first silicon die or tile and a second silicon die or tile attached to the package substrate;
   a first waveguide formed in the package substrate, the first waveguide interconnecting the first silicon die or tile with the second silicon die or tile;
   a second waveguide formed in the package substrate, the second waveguide interconnecting the first silicon die or tile with the second silicon die or tile, wherein the second waveguide is vertically beneath the first waveguide; and
   a conductive interconnect in the package substrate, the conductive interconnect interconnecting the first silicon die or tile with the second silicon die or tile.

2. The electronic package of claim 1, wherein the first waveguide is a radio frequency (RF) waveguide.

3. The electronic package of claim 1, wherein the second waveguide is a radio frequency (RF) waveguide.

4. The electronic package of claim 1, wherein the first waveguide is to communicate ultra-high bandwidth RF signals between the first silicon die or tile and the second silicon die or tile.

5. The electronic package of claim 4, wherein the first silicon die or tile includes an input/output (I/O) block and the second silicon die or tile includes an I/O block, each I/O block is a broadband transceiver for RF signals and to up and down convert frequencies of the RF signals.

6. The electronic package of claim 5, wherein the first waveguide is coupled to the I/O block of the first silicon die or tile and the I/O block of the second silicon die or tile.

7. An electronic package comprising:
   a package substrate;
   a first silicon chip and a second silicon chip attached to the package substrate;
   a multi-layer waveguide structure formed in the package substrate, the multi-layer waveguide structure interconnecting the first silicon chip and second silicon chip, wherein the multi-layer waveguide structure includes a first waveguide and a second waveguide interconnecting the first silicon chip and the second silicon chip, wherein the first waveguide is vertically beneath the second waveguide; and
   a conductive interconnect in the package substrate, the conductive interconnect interconnecting the first silicon chip with the second silicon chip.

8. The electronic package of claim 7, wherein the first waveguide is a radio frequency (RF) waveguide.

9. The electronic package of claim 7, wherein the second waveguide is a radio frequency (RF) waveguide.

10. The electronic package of claim 7, wherein the first waveguide is grounded co-planar waveguide and the second waveguide is a coaxial waveguide.

11. The electronic package of claim 10, wherein the first waveguide and the second waveguide share a common ground plane.

12. The electronic package of claim 10, wherein the first waveguide and the second waveguide include a signal line to communicate ultra-high bandwidth RF signals between the first silicon chip and second silicon chip.

13. A device comprising:
    a substrate; and
    a first stacked die including a plurality of dies attached to the substrate;
    a second stacked die including a plurality of dies attached to the substrate;
    a first waveguide formed in the substrate to interconnect the first stacked die and the second stacked die;
    a second waveguide formed in the substrate to interconnect the first stacked die and the second stacked die, wherein the second waveguide is vertically beneath the first waveguide; and
    a conductive interconnect in the substrate, the conductive interconnect interconnecting the first stacked die with the second stacked die.

14. The device of claim 13, wherein the first waveguide is a radio frequency (RF) waveguide.

15. The device of claim 13, wherein the second waveguide is a radio frequency (RF) waveguide.

16. The device of claim 13, further comprising: a third stacked die including a plurality of dies attached to the substrate.

17. The device of claim 13, wherein the first and second waveguides are to communicate ultra-high bandwidth RF signals.

18. A computing system comprising:
input and output devices; and
at least one integrated circuit die;
the integrated circuit die includes a substrate and at least two die areas interconnected by a first waveguide in the substrate and by a second waveguide in the substrate, the second waveguide vertically beneath the first waveguide, and the at least two die areas further interconnected by a conductive interconnect in the substrate.

19. The computing system of claim 18, wherein the first waveguide is a radio frequency (RF) waveguide.

20. The computing system of claim 18, wherein the second waveguide is a radio frequency (RF) waveguide.

21. The computing system of claim 18, wherein the first waveguide is to communicate ultra-high bandwidth RF signals between the at least two die areas.

22. The computing system of claim 21, wherein each of the at least two die areas include an input/output (I/O) block, each I/O block is a broadband transceiver for RF signals and to up and down convert frequencies of the RF signals.

23. The computing system of claim 22, wherein the first waveguide is coupled to each I/O block of the at least two die areas.

24. A method for electronic package comprising:
transmitting radio frequency (RF) signals to a first waveguide formed in a substrate of the electronic package from a first tile or die in the electronic package, wherein a second waveguide is formed in the package substrate, and wherein the second waveguide is vertically beneath the first waveguide; and
receiving the transmitted RF signal from the first waveguide formed in the substrate of the electronic package by a second tile or die in the electronic package, wherein a conductive interconnect in the substrate of the electronic package is further interconnecting the first tile or die with the second tile or die.

25. The method of claim 24, wherein the RF signals are ultra-high bandwidth RF signals.

* * * * *